US012684819B2

(12) United States Patent
Wang et al.

(10) Patent No.: US 12,684,819 B2
(45) Date of Patent: Jul. 14, 2026

(54) AIR LINER FOR THROUGH SUBSTRATE VIA

(71) Applicant: Taiwan Semiconductor Manufacturing Company, Ltd., Hsin-Chu (TW)

(72) Inventors: Kuan-Hsun Wang, Hsinchu City (TW); Tsung-Chieh Hsiao, Changhua County (TW); Chih Hsin Yang, Hsinchu County (TW); Liang-Wei Wang, Hsinchu City (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 401 days.

(21) Appl. No.: 18/335,796

(22) Filed: Jun. 15, 2023

(65) Prior Publication Data

US 2024/0282837 A1        Aug. 22, 2024

Related U.S. Application Data

(60) Provisional application No. 63/486,411, filed on Feb. 22, 2023.

(51) Int. Cl.
H10D 30/67            (2025.01)
H10D 62/10            (2025.01)
(Continued)

(52) U.S. Cl.
CPC ..... H10D 30/6735 (2025.01); H10D 30/6757 (2025.01); H10D 62/121 (2025.01); H10W 20/023 (2026.01); H10W 20/20 (2026.01)

(58) Field of Classification Search
CPC ........... H01L 21/76898; H01L 21/7682; H01L 21/768; H01L 23/481; H01L 23/5226; H01L 23/5283; H01L 23/5286; H01L 23/562; H10D 30/6735; H10D 30/6757; H10D 30/024; H10D 30/62; H10D 62/121; H10D 64/021; H10W 20/023; H10W 20/20; H10W 20/072; H10W 20/46; H10W 72/942; H10W 72/944; H10W 20/0245;
(Continued)

(56) References Cited

U.S. PATENT DOCUMENTS 8,232,648 B2 *    7/2012    McGahay ......... H01L 21/76898
                                                                     257/E23.145
8,802,504 B1      8/2014    Hou et al.
(Continued)

FOREIGN PATENT DOCUMENTS

KR          20160085184 A      7/2016
KR          10-1767654 B       8/2017

*Primary Examiner* — Andres Munoz
(74) *Attorney, Agent, or Firm* — HAYNES AND BOONE, LLP

(57)                ABSTRACT

A first conductive pad disposed over a first side of a substrate in a first direction. A second conductive pad is disposed over a second side of the substrate in the first direction. A through-substrate via (TSV) extends into the substrate in the first direction. The TSV is disposed between the first conductive pad and the second conductive pad in the first direction. An air liner disposed between the TSV and the substrate in a second direction different from the first direction.

20 Claims, 28 Drawing Sheets

Metallization Process

(51) Int. Cl.
    *H10W 20/00*     (2026.01)
    *H10W 20/20*     (2026.01)
(58) Field of Classification Search
    CPC ......... H10W 20/0265; H10W 20/2134; H10W
               20/01; H10W 20/42; H10W 20/427;
               H10W 20/435; H10W 42/121
    See application file for complete search history.

(56)            References Cited

U.S. PATENT DOCUMENTS

| | | | |
|---|---|---|---|
| 8,803,292 B2 | 8/2014 | Chen et al. | |
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 2012/0292782 A1* | 11/2012 | Lee ....................... | H01L 23/481 |
| | | | 257/774 |
| 2013/0161825 A1* | 6/2013 | Hsu ....................... | H01L 23/481 |
| | | | 257/774 |
| 2014/0264921 A1* | 9/2014 | Gao ....................... | H01L 23/481 |
| | | | 257/774 |
| 2021/0184060 A1 | 6/2021 | Mizuta | |
| 2022/0084885 A1* | 3/2022 | Han .................... | H01L 21/7682 |

\* cited by examiner

90

120

120

130

122     122

122     122

140     140     140     140     140

Y

X

AIR LINER FOR THROUGH SUBSTRATE VIA

PRIORITY INFORMATION

This application claims the priority to U.S. Provisional Application Ser. No. 63/486,411, filed on Feb. 22, 2023, entitled "Through-Substrate Via (Tsv) Liner With Reduced Capacitance," the disclosure of which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs. For example, existing fabrication methods may lead to components having excessive parasitic capacitance. Therefore, although conventional methods of fabricating semiconductor devices have generally been adequate, they have not been satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1A:
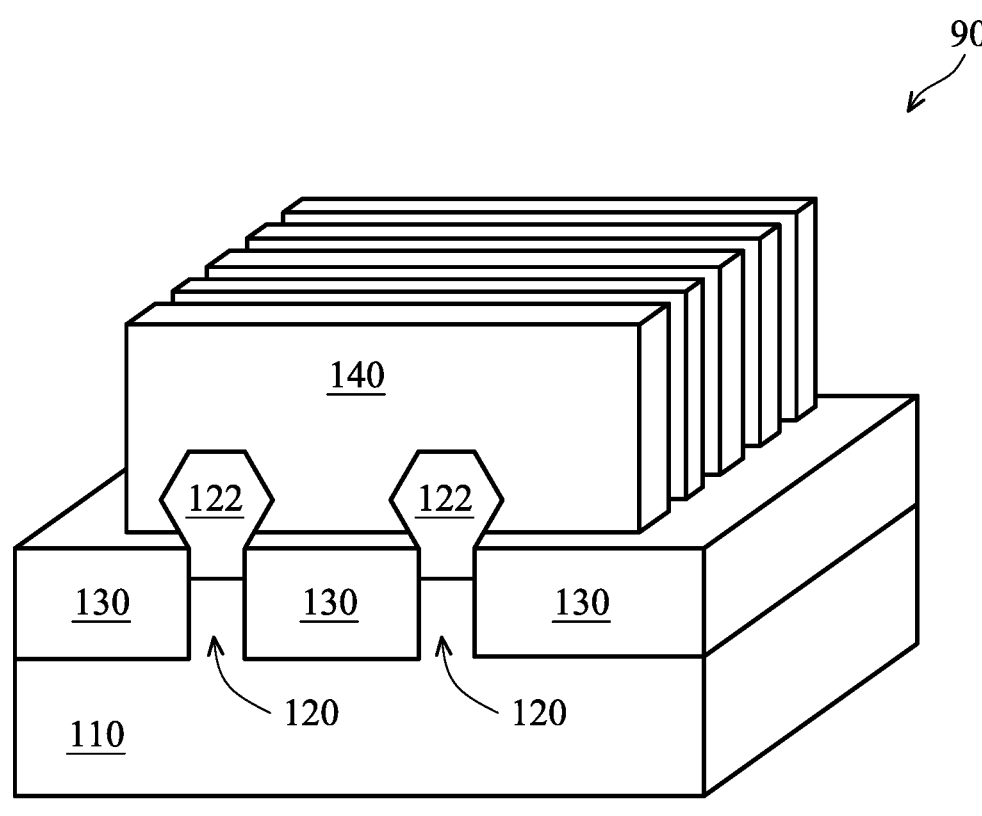
FIG. 1A illustrates a three-dimensional perspective view of a FinFET device.
Figure 1A:
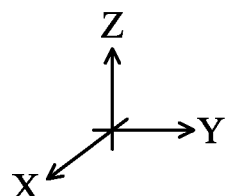

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to 3-dimensional integrated circuits (3DICs), such as a package including a through-substrate via (TSV) structure. In more detail, thermal dissipation is a concern for 3DICs due to the thinness of the die. A thicker substrate may be helpful for thermal dissipation, but it also leads to an increase in parasitic capacitance. Air has a low capacitance, which may be utilized herein to reduce the parasitic capacitance. For example, the present disclosure introduces air liners as a novel TSV liner to reduce parasitic capacitance.

Figure 1B:
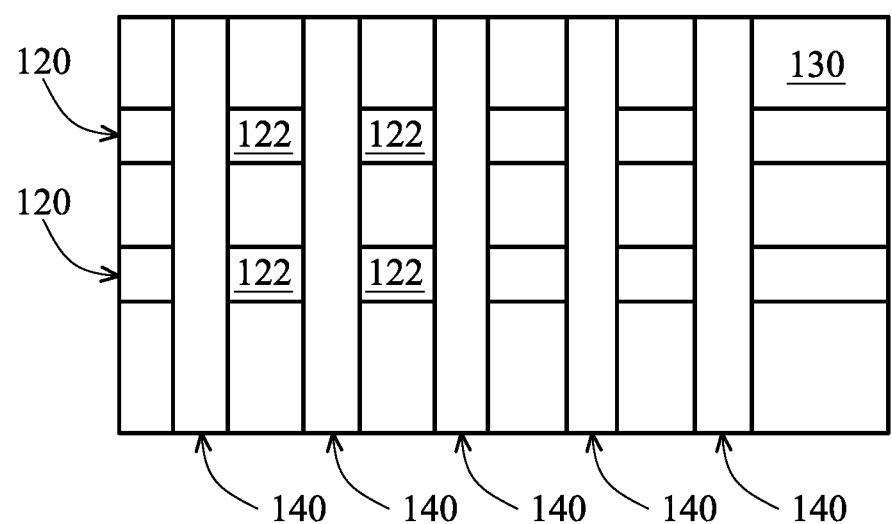
FIG. 1B illustrates a top view of a FinFET device.
Figure 1C:
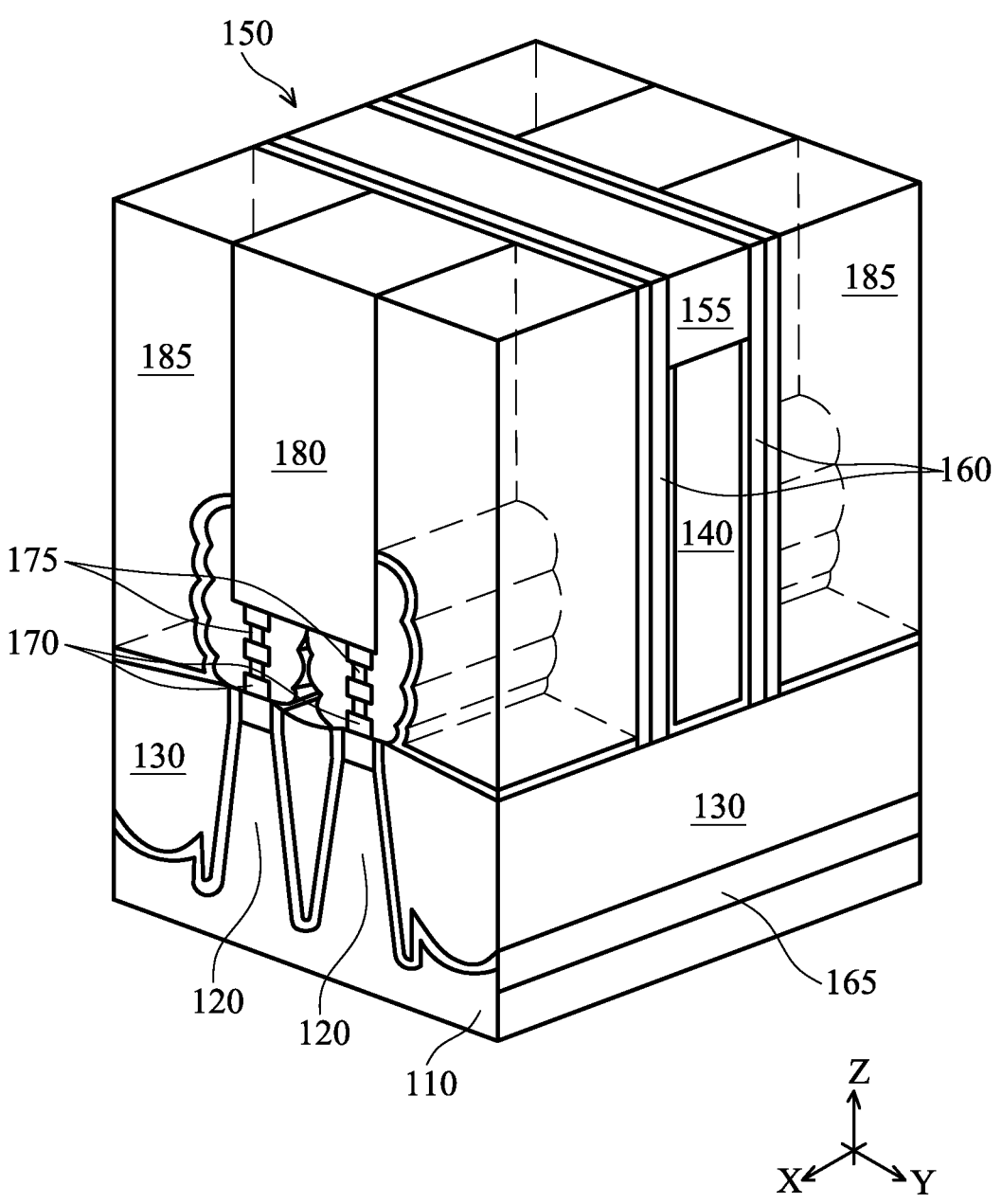
FIG. 1C illustrates a three-dimensional perspective view of a multi-channel gate-all-around (GAA) device.

The various aspects of the present disclosure will now be discussed below with reference to FIGS. 1A-1C and 2-26. In more detail, FIGS. 1A-1C illustrate example transistors that may be formed as a part of a 3DIC device. For example, field-effect transistors (FETs), such as three-dimensional fin-shaped FETs (FinFETs) or gate-all-around (GAA) devices may be formed as components of the 3DIC device. In that regard, a FinFET device is a fin-like field-effect transistor device, and a GAA device is a multi-channel field-effect transistor device. FinFET devices and GAA devices have both been gaining popularity recently in the semiconductor industry, since they offer several advantages over traditional Metal-Oxide Semiconductor Field Effect Transistor (MOSFET) devices (e.g., "planar" transistor devices). These advantages may include better chip area efficiency, improved carrier mobility, and fabrication processing that is compatible with the fabrication processing of planar devices. Thus, it may be desirable to design an integrated circuit (IC) chip using FinFET devices or GAA devices for a portion of, or the entire IC chip.

Referring now to FIGS. 1A and 1B, a three-dimensional perspective view and a top view of a portion of an Integrated Circuit (IC) device 90 are illustrated, respectively. The IC device 90 is implemented as a FinFET. As shown in FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 may include elongated fin-like structures that protrude upwardly out of the substrate 110. As such, the active regions 120 may be interchangeably referred to as fin structures 120 or fins 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain components 122 formed over the fin structures 120. The source/drain components 122 may include epi-layers that are epitaxially grown on the fin structures 120. Source/drain components 122 may refer to a source or a drain, individually or collectively dependent upon the context. A source/drain component (or a source/drain region) may also refer to a component (or a region) that provides a source and/or drain for multiple devices.

The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material (having a dielectric constant smaller than about 3.9), and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fin structures 120 on three sides in a channel region of each fin 120. In other words, the gate structures 140 each wrap around a plurality of fin structures 120. The gate structures 140 may be dummy gate structures (e.g., containing an oxide gate dielectric and a polysilicon gate electrode), or they may be High-k metal gate (HKMG) structures that contain a high-k gate dielectric and a metal gate electrode, where the HKMG structures are formed by replacing the dummy gate structures. Though not depicted herein, the gate structure 140 may include additional material layers, such as an interfacial layer over the fin structures 120, a capping layer, other suitable layers, or combinations thereof.

Referring to FIGS. 1A-1B, multiple fin structures 120 are each oriented lengthwise along the X-direction, and multiple gate structure 140 are each oriented lengthwise along the Y-direction, i.e., generally perpendicular to the fin structures 120. In many embodiments, the IC device 90 includes additional features such as gate spacers disposed along sidewalls of the gate structures 140, hard mask layer(s) disposed over the gate structures 140, and numerous other features.

FIG. 1C illustrates a three-dimensional perspective view of an example multi-channel gate-all-around (GAA) device 150. GAA devices have multiple elongated nano-structure channels that may be implemented as nano-tubes, nano-sheets, or nano-wires. For reasons of consistency and clarity, similar components in FIG. 1C and FIGS. 1A-1B will be labeled the same. For example, active regions such as fin structures 120 rise vertically upwards out of the substrate 110 in the Z-direction. The isolation structures 130 provide electrical separation between the fin structures 120. The gate structure 140 is located over the fin structures 120 and over the isolation structures 130. A mask 155 is located over the gate structure 140, and gate spacers 160 are located on sidewalls of the gate structure 140. A capping layer 165 is formed over the fin structures 120 to protect the fin structures 120 from oxidation during the forming of the isolation structures 130.

A plurality of nano-structures 170 is disposed over each of the fin structures 120. The nano-structures 170 may include nano-sheets, nano-tubes, or nano-wires, or some other type of nano-structure that extends horizontally in the X-direction. Portions of the nano-structures 170 under the gate structure 140 may serve as the channels of the GAA device 150. Dielectric inner spacers 175 may be disposed between the nano-structures 170. In addition, although not illustrated for reasons of simplicity, each stack of the nano-structures 170 may be wrapped around circumferentially by a gate dielectric as well as a gate electrode. In the illustrated embodiment, the portions of the nano-structures 170 outside the gate structure 140 may serve as the source/drain features of the GAA device 150. However, in some embodiments, continuous source/drain features may be epitaxially grown over portions of the fin structures 120 outside of the gate structure 140. Regardless, conductive source/drain contacts 180 may be formed over the source/drain features to provide electrical connectivity thereto. An interlayer dielectric (ILD) 185 is formed over the isolation structures 130 and around the gate structure 140 and the source/drain contacts 180. The ILD 185 may be referred to as an ILD0 layer. In some embodiments, the ILD 185 may include silicon oxide, silicon nitride, or a low-k dielectric material.

The FinFET devices of FIGS. 1A-1B and the GAA devices of FIG. 1C may be utilized to implement electrical circuitries having various functionalities, such as memory devices (e.g., static random access memory (SRAM) devices), logic circuitries, application specific integrated circuit (ASIC) devices, radio frequency (RF) circuitries, drivers, micro-controllers, central processing units (CPUs), image sensors, etc., as non-limiting examples.

FIGS. 2-24 illustrate diagrammatic fragmentary cross-sectional views of a portion of a three-dimensional IC (3DIC) device 200 at various stages of fabrication. FIGS. 2-24 correspond to three different embodiments, with FIGS. 2-9 corresponding to a first embodiment of the present disclosure, FIGS. 10-15 corresponding to a first embodiment of the present disclosure, and FIGS. 16-24 corresponding to a third embodiment of the present disclosure.

Figure 2:
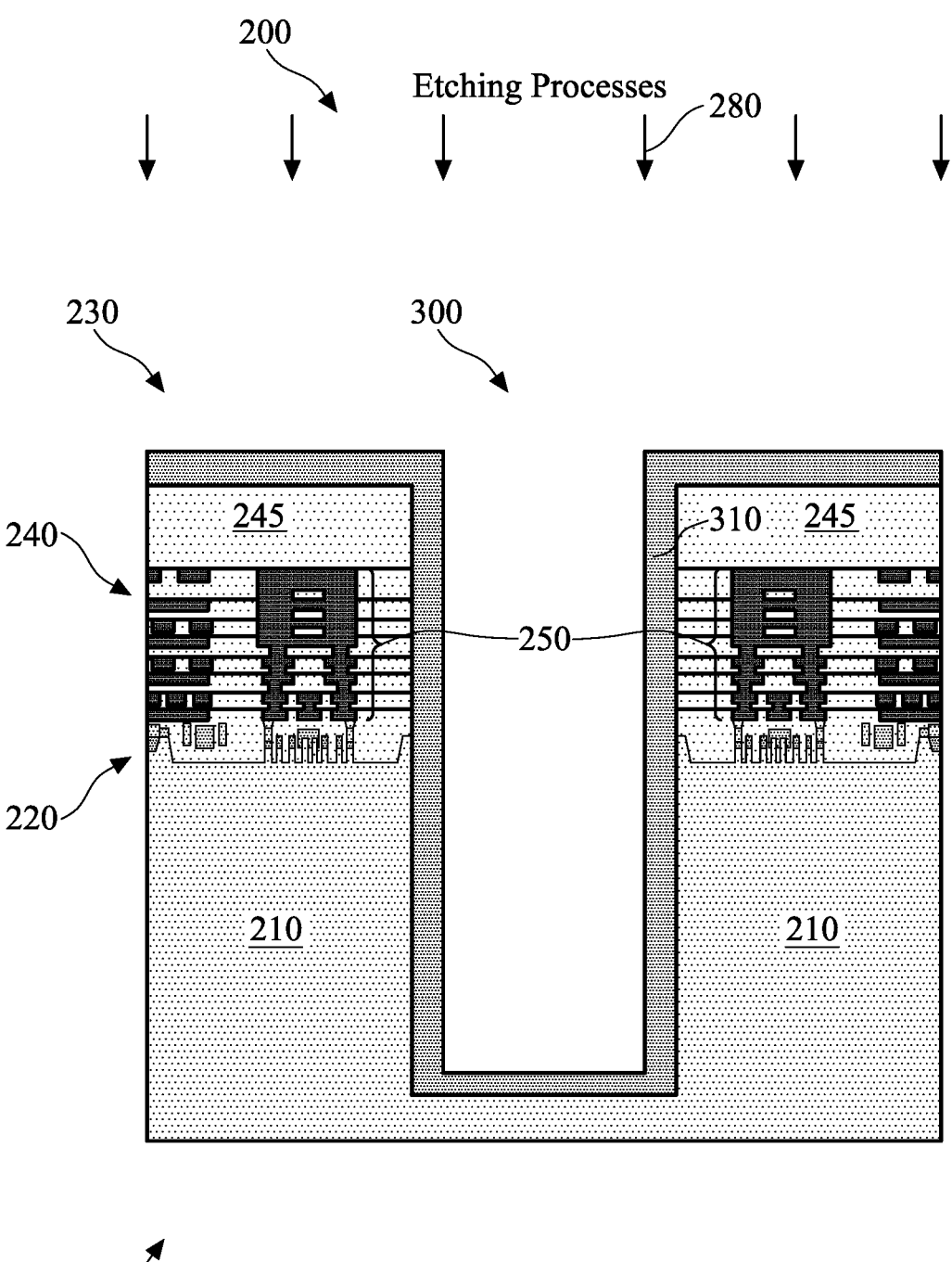
FIGS. 2-24 illustrate a series of cross-sectional views of an IC device at various stages of fabrication according to embodiments of the present disclosure.

Referring to FIG. 2, the 3DIC device 200 includes a substrate 210. In some embodiments, the substrate 210 includes a silicon substrate. In other embodiments, the substrate 210 may include a different type of material, for example, a different type of semiconductor material. A plurality of fabrication processes has already been performed to the 3DIC device 200 to form various components. For example, the FinFET devices or GAA devices discussed above with reference to FIGS. 1A-1C may be formed in the 3DIC device 200, for example, as a part of electrical circuitry 220. In some embodiments, the electrical circuitry 220 may be a part of a system on a chip (SoC) device.

The substrate 210 has a front side 230 and a back side 231 that is opposite the front side 230. The front side 230 and the back side 231 may also be considered to be the front side and the back side of the 3DIC device 200, respectively. The electrical circuitry 220 is formed over the front side 230 of the substrate 210.

A multi-layer interconnect structure 240 is also formed over the front side 230 of the substrate 210. At its completion, the multi-layer interconnect structure 240 may include a plurality of metal layers that include interconnection elements such as metal lines, as well as conductive vias that vertically interconnect different metal lines from different metal layers. The metal lines and the conductive vias are embedded in a dielectric material 245, such as a silicon oxide material or a low-k dielectric material.

Portions of the multi-layer interconnect structure 240 may be used to implement a plurality of guard ring (GR) structures 250. For example, each guard ring structure 250 is comprised of a vertical stack of metal lines and vias of the multi-layer interconnect structure 240. The guard ring structures 250 protect the components of the 3DIC device 200 from undesirable elements in semiconductor fabrication, such as moisture, humidity, contaminant particles, or even pressure exerted against the 3DIC device 200 (e.g., pressure exerted by a dicing/sawing tool in a singulation process). This is because the guard ring structures can form an enclosed barrier around the components that need to be protected, such that the undesirable elements discussed above (e.g., moisture, contaminant particles, etc.) cannot penetrate through the barrier to adversely affect the other components within the 3DIC device 200.

Still referring to FIG. 2, one or more etching processes 280 may be performed to the 3DIC device 200 to form an opening 300. For example, a patterned photoresist layer (including an opening) may be formed over the front side 230 of the 3DIC device 200. Thereafter, the one or more etching processes 280 may be performed. In some embodiments, the etching processes may include wet etching processes. In other embodiments, the etching processes may include dry etching processes. The patterned photoresist layer may serve as a protective mask during the etching processes 280, such that portions of the 3DIC device 200 not protected by the patterned photoresist layer may be etched away during the etching processes 280.

As shown in FIG. 2, the opening 300 extends vertically through the interconnect structure (e.g., separating the guard ring structures 250) and through portions of the substrate 210, though the opening 300 does not completely extend vertically through the substrate 210. Note that the guard ring structures 250 help to protect components of the 3DIC device 200 (e.g., the SoC that comprises the electrical circuitry 220) from moisture, stress, and/or contaminant particles that may be introduced during the etching processes 280.

After the opening 300 has been formed, a deposition process (e.g., chemical vapor deposition (CVD), physical vapor deposition (PVD), or atomic layer deposition (ALD)) maybe performed to deposit a liner layer 310 over the 3DIC device 200. The liner layer 310 partially fills the opening 300. For example, the liner layer 310 is deposited on the bottom surface and the side surfaces that define the opening 300. In some embodiments, the liner layer 310 includes a dielectric material, such as silicon oxide. In other embodiments, however, the liner layer 310 may include other types of dielectric materials, such as a low-k dielectric (e.g., having a dielectric constant smaller than that of silicon dioxide) material. In some embodiments, the liner layer 310 has a dielectric constant in a range between about 1 and about 3. Example materials of the liner layer 310 may include SiOC(N), SiB, SiBN, $AlO_x$, or $LTO_x$. It is understood that the liner layer 310 will be removed in a later process to form air liners. In some embodiments, the liner layer 310 has a thickness between about 0.1 micron and about 0.3 microns. This value range is optimized. If the liner layer 310 is too thick, then the size of the TSV structure (to be formed subsequently) may also need to be increased. If the liner layer 310 is not thick enough, then it may not be able to block the water gas/vapor or other forms of moisture.

Figure 3:
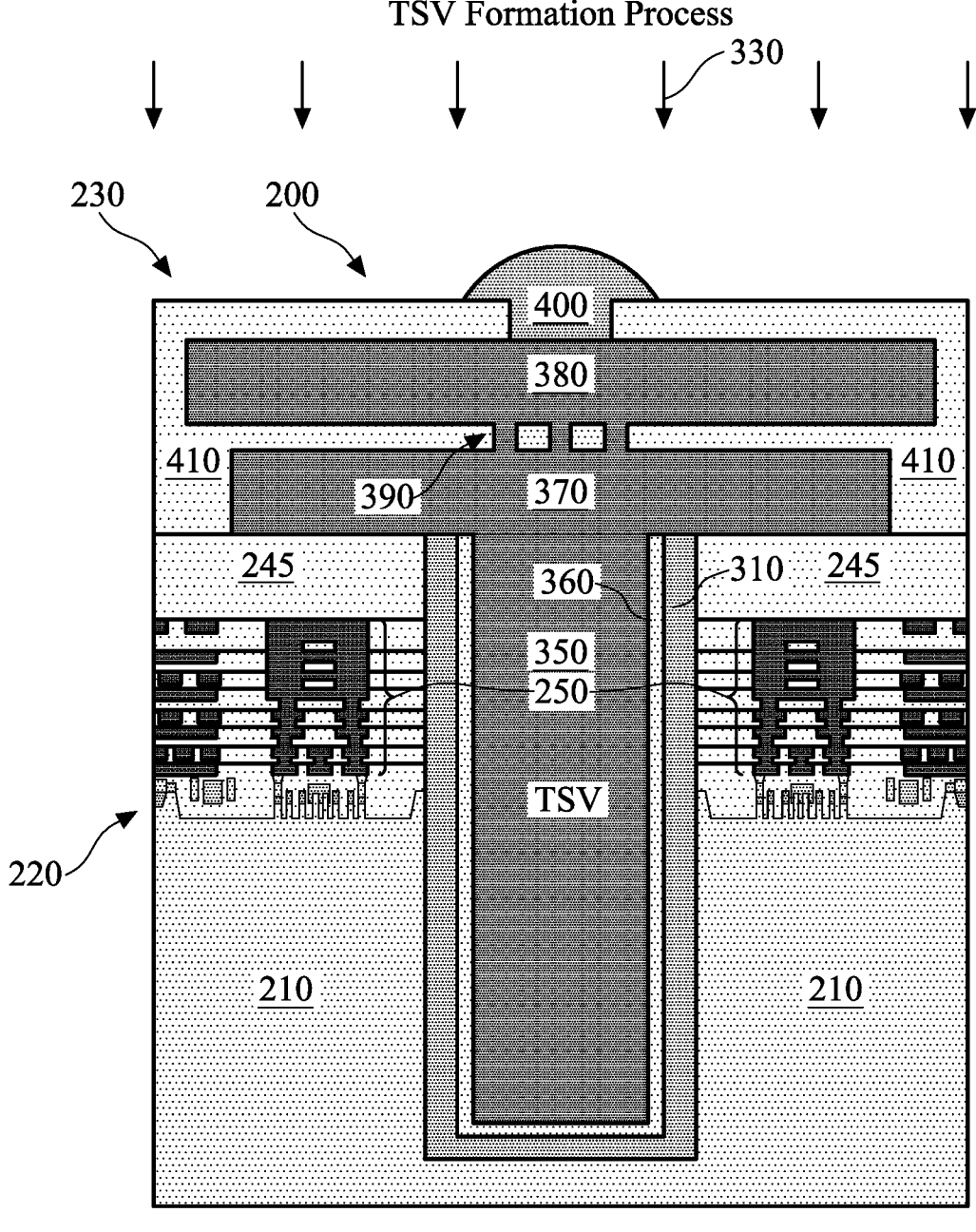

Referring now to FIG. 3, a TSV formation process 330 is performed to the 3DIC device 200 to form a TSV structure 350. In more detail, as a first step of the TSV formation process 330, a layer 360 may be deposited on the liner layer 310 in the opening 300. In some embodiments, the layer 360 includes a seed layer for a subsequent electroplating process. The seed player may include a conductive material, such as copper, aluminum, tungsten, cobalt, titanium, or combinations thereof. In some embodiments, the layer 360 may also include a barrier layer in addition to the seed layer. The barrier layer is configured to prevent or reduce undesirable diffusion.

As a second step of the TSV formation process 330, an electroplating process may be performed to completely fill the opening 300 with a conductive material (such as copper, aluminum, tungsten, cobalt, titanium, or combinations thereof). Note that the conductive material filling the opening 300 may have a same material composition as the seed layer (e.g., the layer 360). As such, there may not be a discernable interface between the conductive material filling the opening 300 and the seed layer. Thereafter, one or more planarization processes (CMP process) maybe performed to planarize or otherwise flatten an upper surface of the conductive material filling the opening 300. The TSV structure 350 is formed by the remaining portion of the conductive material in the opening 300.

Following the formation of the TSV structure 350, a plurality of backend-of-the-line processes may be performed to form additional metallization components over the front side 230 of the 3DIC device 200. For Example, a conductive pad 370 is formed directly on the TSV structure 350, and another conductive pad 380 is formed over the conductive pad 370. The conductive pad 370 may also be referred to as a top metal pad, and the conductive pad 380 may also be referred to as an access pad. The conductive pad 370 and the conductive pad 380 may each contain a conductive material such as aluminum or copper, though it is possible that the conductive pad 370 and the conductive pad 380 may have different material compositions. The conductive pad 370 and the conductive pad 380 may also be electrically coupled together by a plurality of conductive vias 390. A conductive bump 400 (e.g., a solder bump) may also be formed over the conductive pad 380. The conductive pad 370, the conductive pad 380, the conductive vias 390, and a portion of the conductive bump 400 may be embedded within a passivation structure 410, which may include one or more dielectric materials. Through the conductive bump 400, the conductive pad 380, and the conductive pad 370, electrical access to the TSV structure 350 may be gained.

Figure 4:
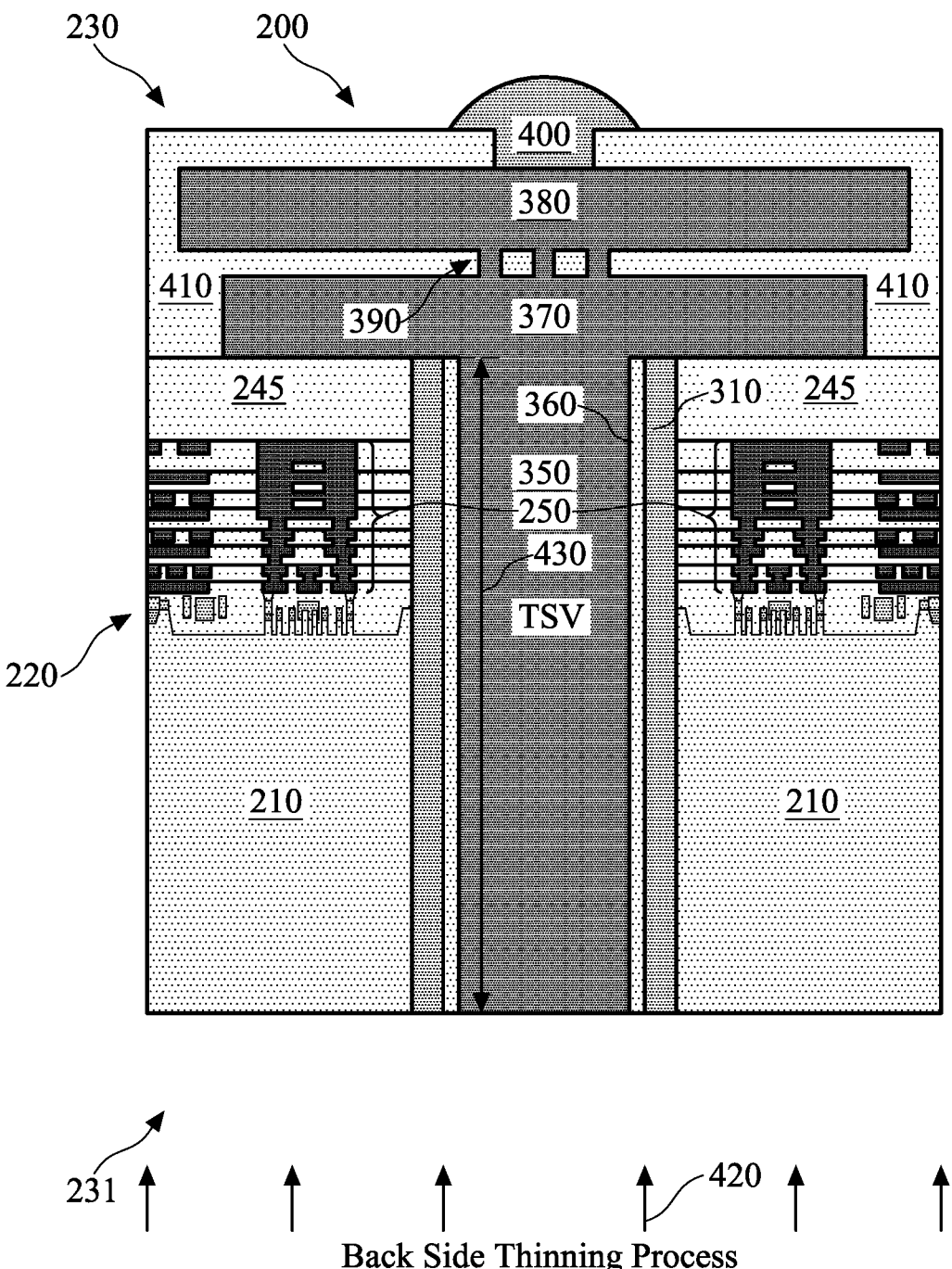

Referring now to FIG. 4, a back side thinning process 420 is performed to the 3DIC device 200. In more detail, the back side thinning process 420 may include one or more chemical etching and/or mechanical grinding processes, which are configured to remove portions (e.g., including the substrate 210, the liner layer 310, the layer 360, and the TSV structure 350) of the 3DIC device 200 from the back side 231. The back side thinning process 420 is performed until the bottom surface (the surface facing the back side 231) of the TSV structure 350 is exposed. At this stage of fabrication, the TSV structure 350 has a vertical dimension 430 (which may also be referred to as a thickness of the TSV). In some embodiments, the vertical dimension 430 may be in a range from about 1 micron to about 50 microns.

Figure 5:
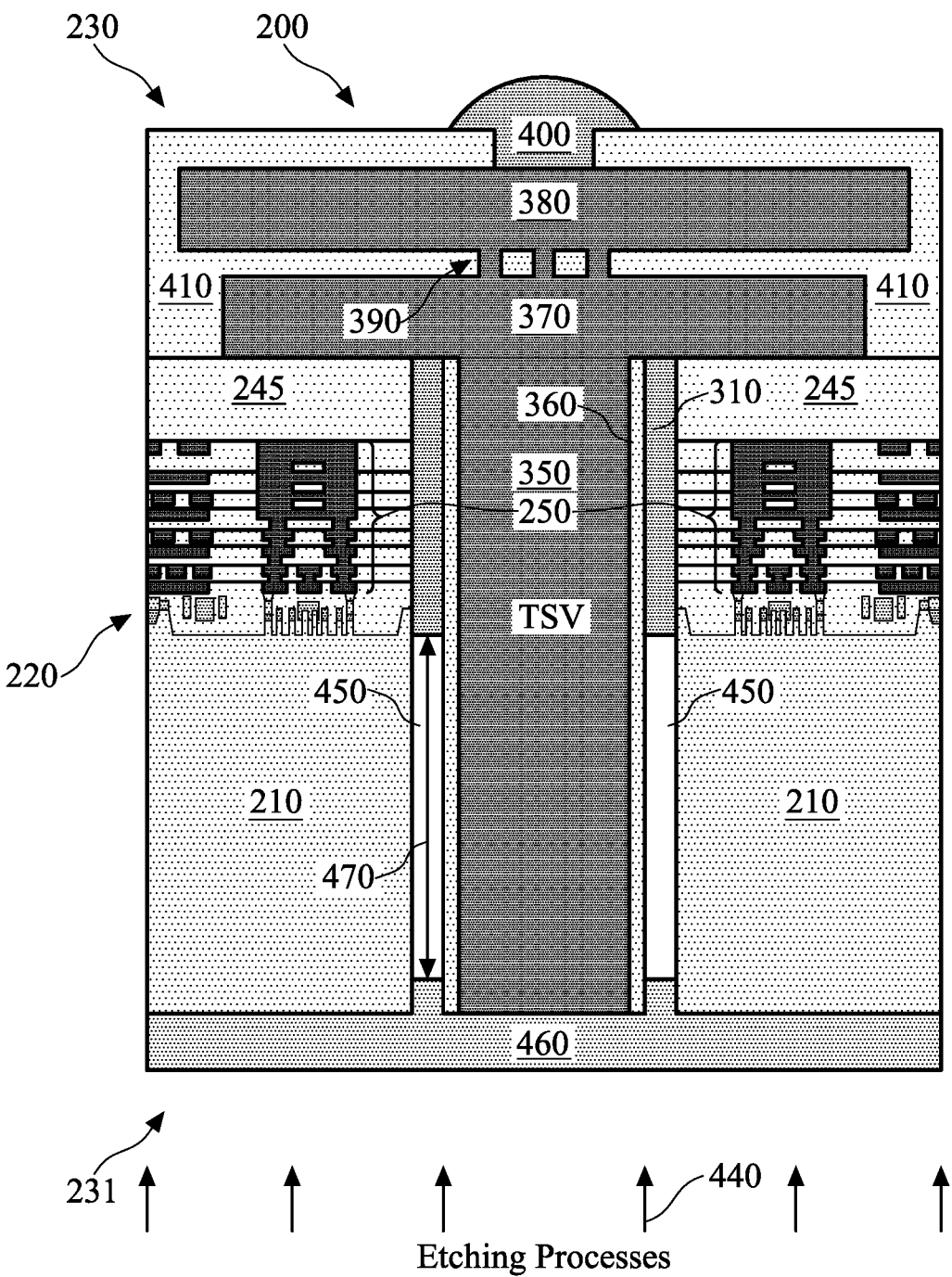

Referring now to FIG. 5, one or more etching processes 440 may be performed to the 3DIC device 200 to form air liners 450 between the substrate 210 and the TSV structure 350. The one or more etching processes 440 may include wet etching processes, dry etching processes, or combinations thereof. The one or more etching processes 440 are configured to have an etching selectivity between the liner layer 310 and the substrate 210. For example, one or more etching processes 440 may be configured to have a substantially higher etching rate (e.g., five times greater, ten times greater, or more) for the liner layer 310 than for the substrate 210. As such, when the one or more etching processes 440 are performed from the back side 231 of the 3DIC device 200, portions of the liner layer 310 are etched away at the substantially higher etching rate than the substrate 210. As a result, air gaps-which may hereinafter be referred to as air liners 450—are formed in place of the removed portions of the liner layer 310, while the substrate 210 remains substantially unaffected. Note that the one or more etching processes 440 may also be performed with a sufficiently high etching selectivity between the liner layer 310 and the TSV structure 350 as well, such that the formation of the air liners 450 does not substantially affect the TSV structure 350 either.

After the air liners 450 have been formed, an isolation film 460 is formed on the back side 231 of the 3DIC device 200. In some embodiments, the isolation film 460 includes silicon oxide, silicon nitride, or polyimide. The isolation film 460 may be formed via one or more deposition processes. The deposition processes are configured to deposition portions of the isolation film 460 to partially (but not completely) fill the air liners 450. In other words, the isolation film 460 is formed to plug up or otherwise seal the air liners 450 from the back side 231.

As shown in FIG. 5, the air liners 450 formed herein each have a vertical dimension 470 (also referred to as a length of the air liners 450) at this stage of fabrication. One of the advantages of the present disclosure is that the vertical dimension 470 is tunable. For example, the parameters of the etching processes 440 may be adjusted to configure how much of the liner layer 310 is removed as a result, which in turn sets the vertical dimension 470 of the air liners 450. For example, a longer etching time or a stronger etchant may result in a greater vertical dimension 470 for the air liners 450. Conversely, a shorter etching time or a weaker etchant may result in a smaller vertical dimension 470 for the air liners 450. The tunability of the vertical dimension 470 of the air liners 450 allows the overall dielectric constant (and therefore the capacitance) of the 3DIC device 200 to be flexibility configured, depending on design needs and/or fabrication requirements.

Figure 6:
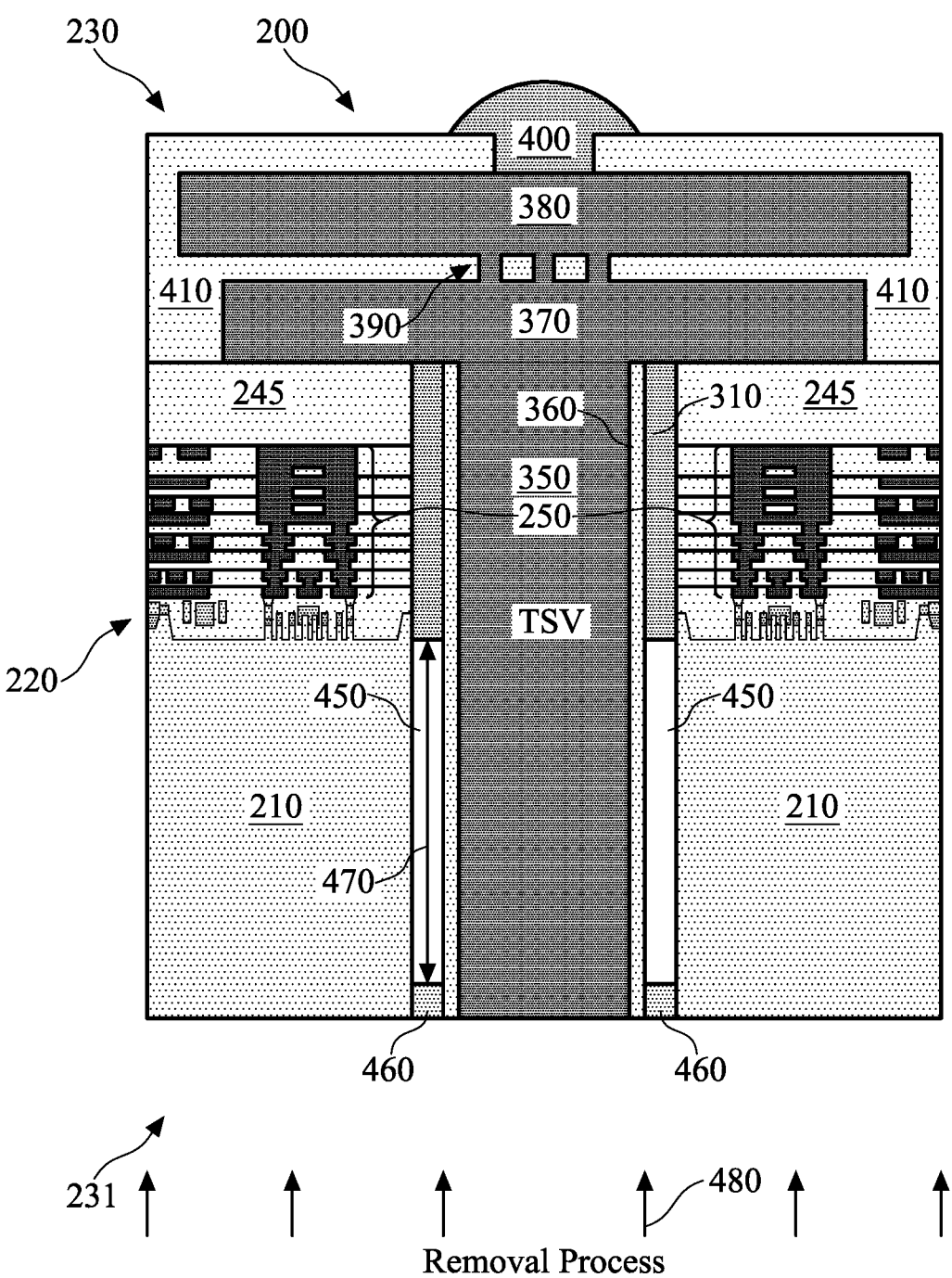

Referring now to FIG. 6, a removal process 480 may be performed to the 3DIC device 200 from the back side 231 to partially remove the isolation film 460. For example, the removal process 480 may include dry etching processes, CMP processes, or combinations thereof. The removal process 480 is configured to stop when the substrate 210 is reached or when the TSV structure 350 is reached. After the removal process 480 has been performed, the substrate 210 and the TSV structure 350 are exposed to the back side 231. The remaining portions of the isolation film 460 still seal the air liners 450, so that the air liners 450 are not exposed to the back side 231.

Figure 7:
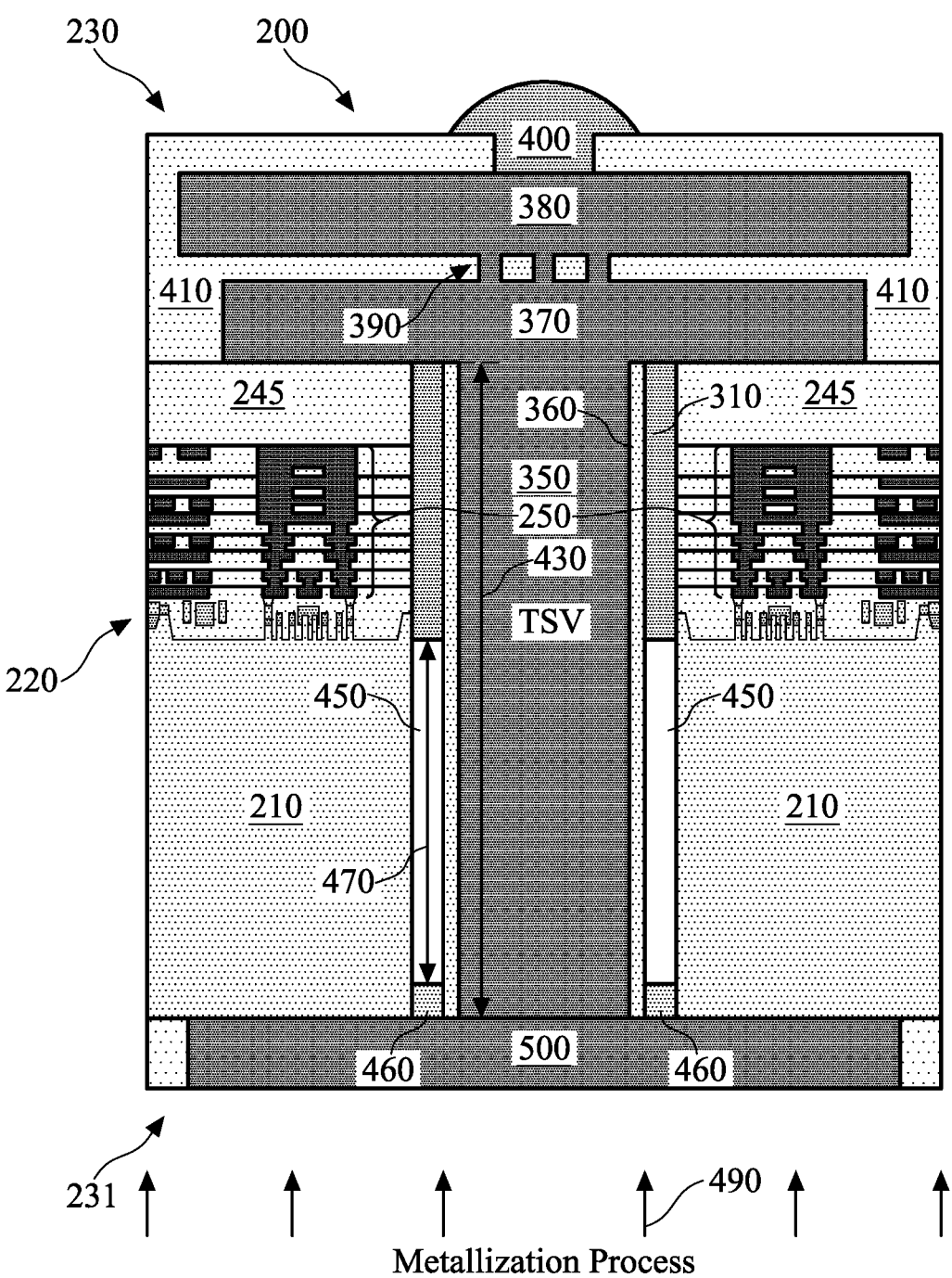

Referring now to FIG. 7, a metallization process 490 may be performed to the 3DIC device 200 to form a conductive pad 500 over the back side 231 of the 3DIC device 200. For example, the conductive pad 500 is formed on the back side surfaces of the substrate 210, the TSV structure 350, and the remaining portions of the isolation film 460. The conductive pad 500 includes a conductive material (e.g., copper or aluminum), and as such, the conductive pad 500 is electrically coupled to the conductive pads 370 and 380 by the TSV structure 350.

The implementation of the air liners 450 herein helps to reduce the parasitic capacitance of the 3DIC device 200. In more detail, air has a relatively low dielectric constant (a value of 1) compared to other types of dielectric materials. Since parasitic capacitance is directly correlated to a value of a dielectric constant of a dielectric material, lowering the dielectric constant (e.g., by implementing air liners 450 herein) would lower the overall parasitic capacitance. A time constant-which is inversely correlated with speed—is a product of resistance and capacitance. As such, reducing parasitic capacitance (e.g., by implementing air liners 450 herein) will reduce the time constant and increase the speed of the 3DIC device 200. Hence, it can be seen that the implementation of the air liners 450 herein can improve the performance of the 3DIC device 200.

As discussed above, the value of the vertical dimension 470 of the air liners 450 may be flexibly tuned by configuring the process parameters of the etching processes 440. In the embodiment shown in FIG. 7, the vertical dimension 470 of the air liners 450 is configured such that a boundary between the liner layer 310 and the air liners 450 is substantially co-planar with (e.g., at around the same vertical elevation) as the upper surface of the substrate 210. However, this is merely an example, and that other embodiments may have different lengths for the air liners 450.

Figure 8:
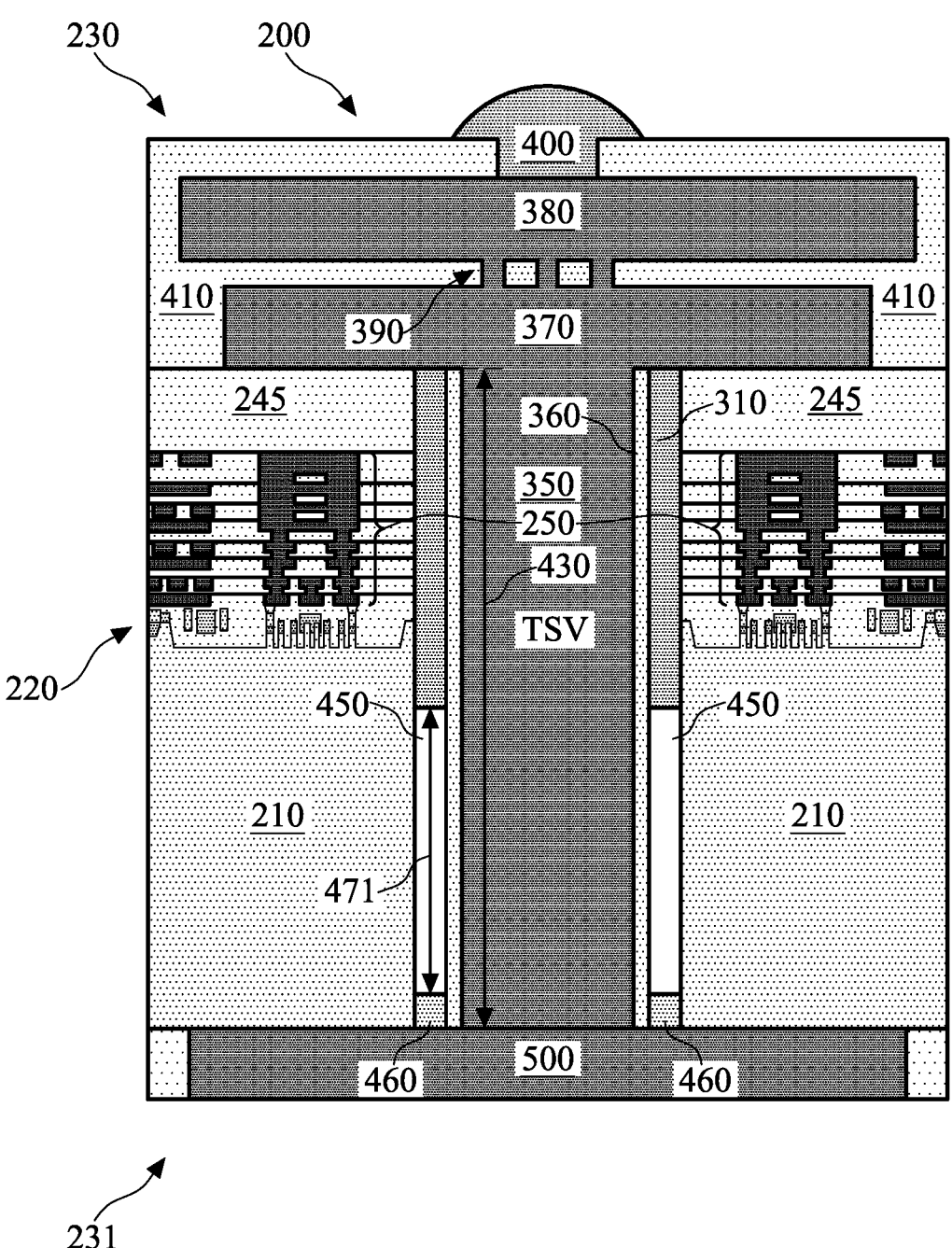

For example, in a variation of the first embodiment shown in FIG. 8, the air liners 450 each have a vertical dimension 471 that is smaller than the vertical dimension 470 of the air liners 450 of the embodiment of FIG. 7. As shown in FIG. 8, the vertical dimension 471 of the air liners 450 is configured such that a boundary between the liner layer 310 and the air liners 450 is below (e.g., at a lower vertical elevation than) the upper surface of the substrate 210.

Figure 9:
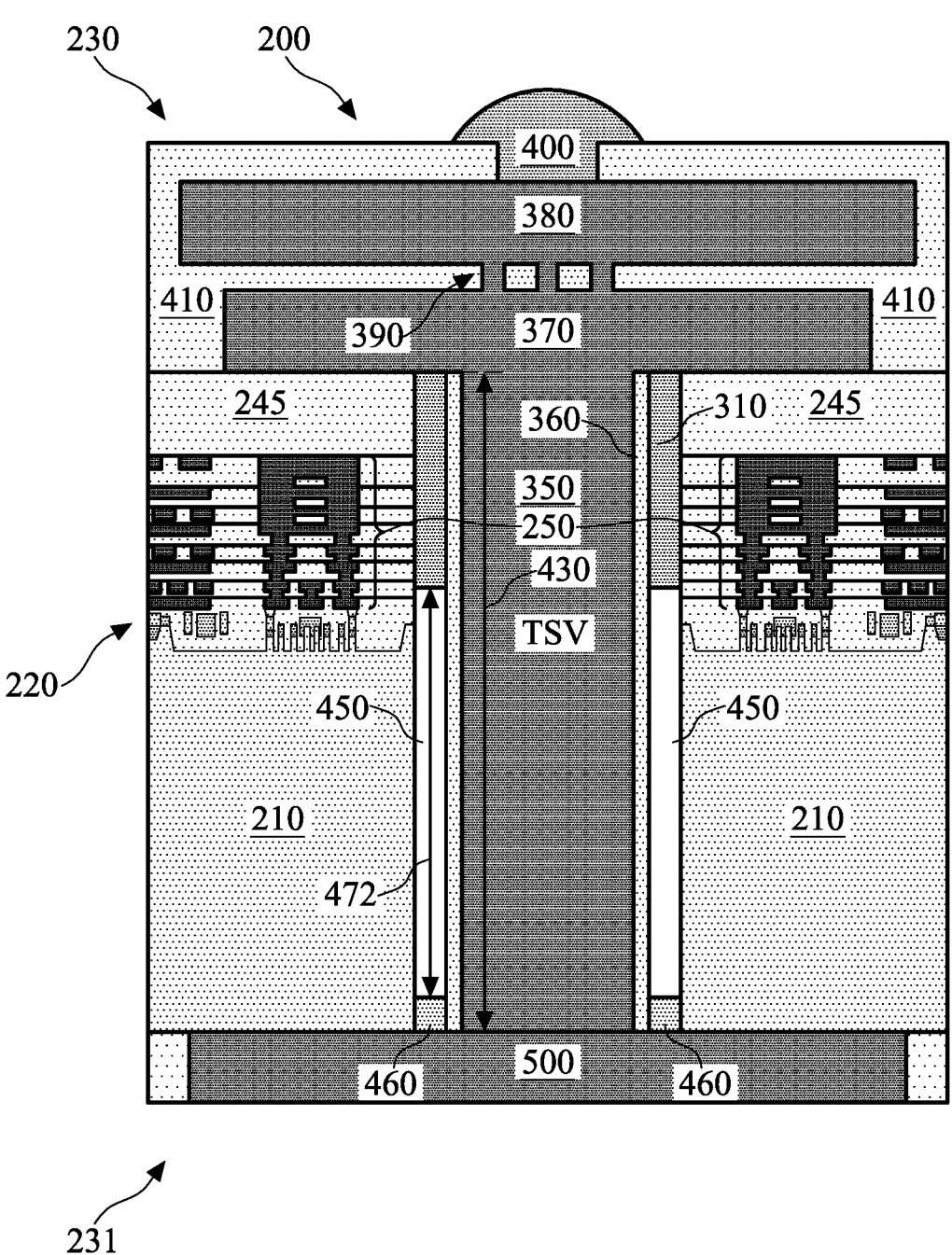

As another example, in another variation of the first embodiment shown in FIG. 9, the air liners 450 each have a vertical dimension 472 that is greater than the vertical dimension 470 of the air liners 450 of the embodiment of FIG. 7. As shown in FIG. 9, the vertical dimension 472 of the air liners 450 is configured such that a boundary between the liner layer 310 and the air liners 450 is above (e.g., at a higher vertical elevation than) the upper surface of the substrate 210. Again, in either of the embodiments shown in FIG. 8 or FIG. 9, the exact value of the vertical dimensions 471 or 472 may be tuned for the air liners 450, so that the 3DIC device 200 can achieve a desired capacitance via the tunable length of the air liners 450.

Note that since the liner layer 310 is not completely removed in any of the embodiments shown in FIGS. 7-9, the vertical dimensions 470-472 is less than the vertical dimension 430 of the TSV structure 350. It is also understood that the horizontal dimension of the air liners 450 may be tuned by adjusting the horizontal dimension of the liner layer 310 as well. If a thicker liner layer 310 was deposited initially, then the resulting air liner 450 would have a greater horizontal dimension. Conversely, if a narrower liner layer 310 was deposited initially, then the resulting air liner 450 would have a smaller horizontal dimension. As such, the air liners 450 herein have both a tunable length and a tunable width.

Figure 10:
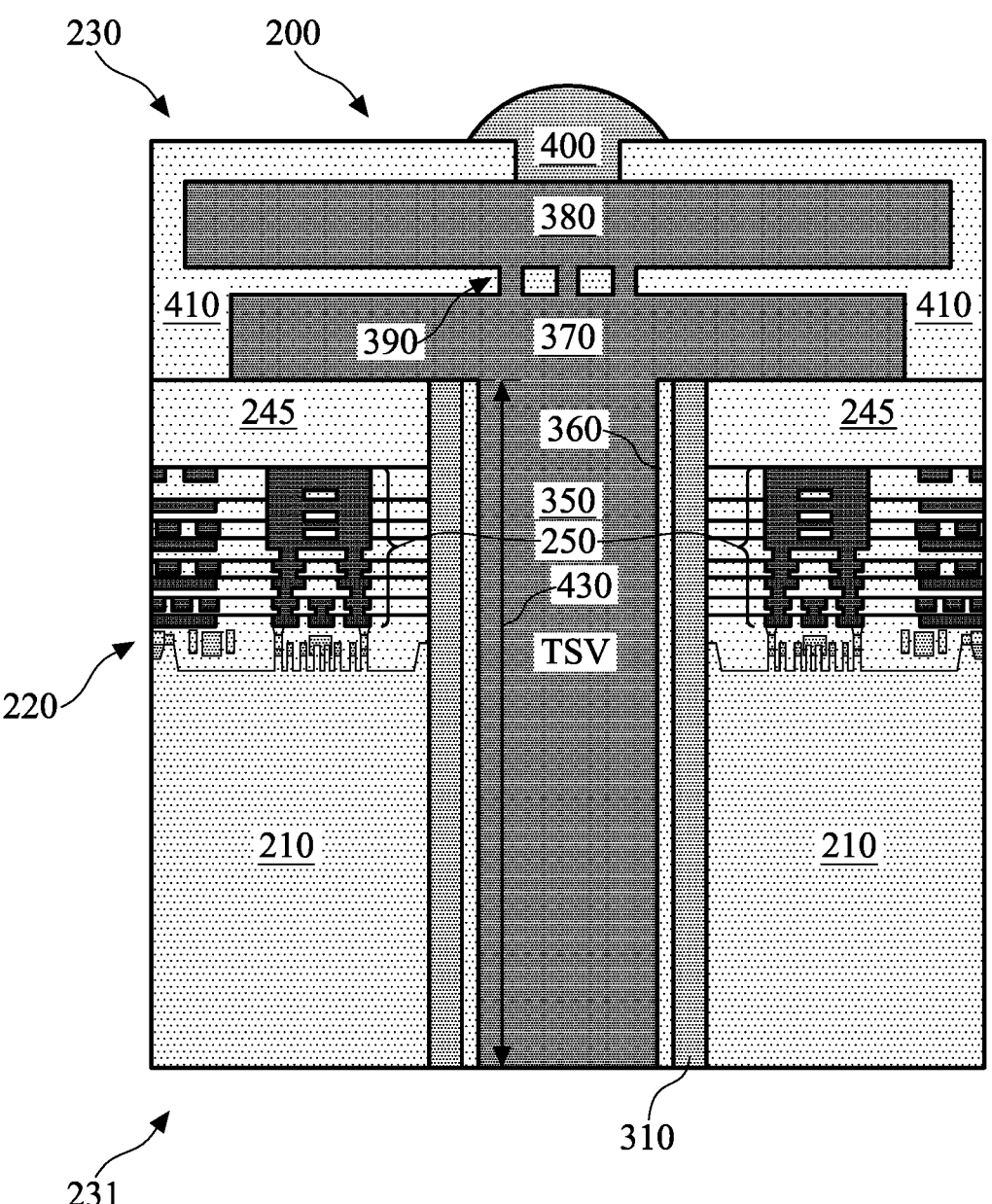

FIGS. 2-9 correspond to a first embodiment of forming air liners. A second embodiment of forming air liners will be discussed below with reference to FIGS. 10-15. For reasons of consistency and clarity, similar components appearing in FIGS. 2-15 will be labeled the same. Referring now to FIG. 10, the second embodiment of the present disclosure also performs the etching processes 280 discussed above with reference to FIG. 2, the TSV formation process 330 discussed above with reference to FIG. 3, and the back side thinning process 420 discussed above with reference to FIG. 4. At this stage of fabrication, the TSV structure 350 has been formed, but no air liners have been formed yet.

Figure 11:
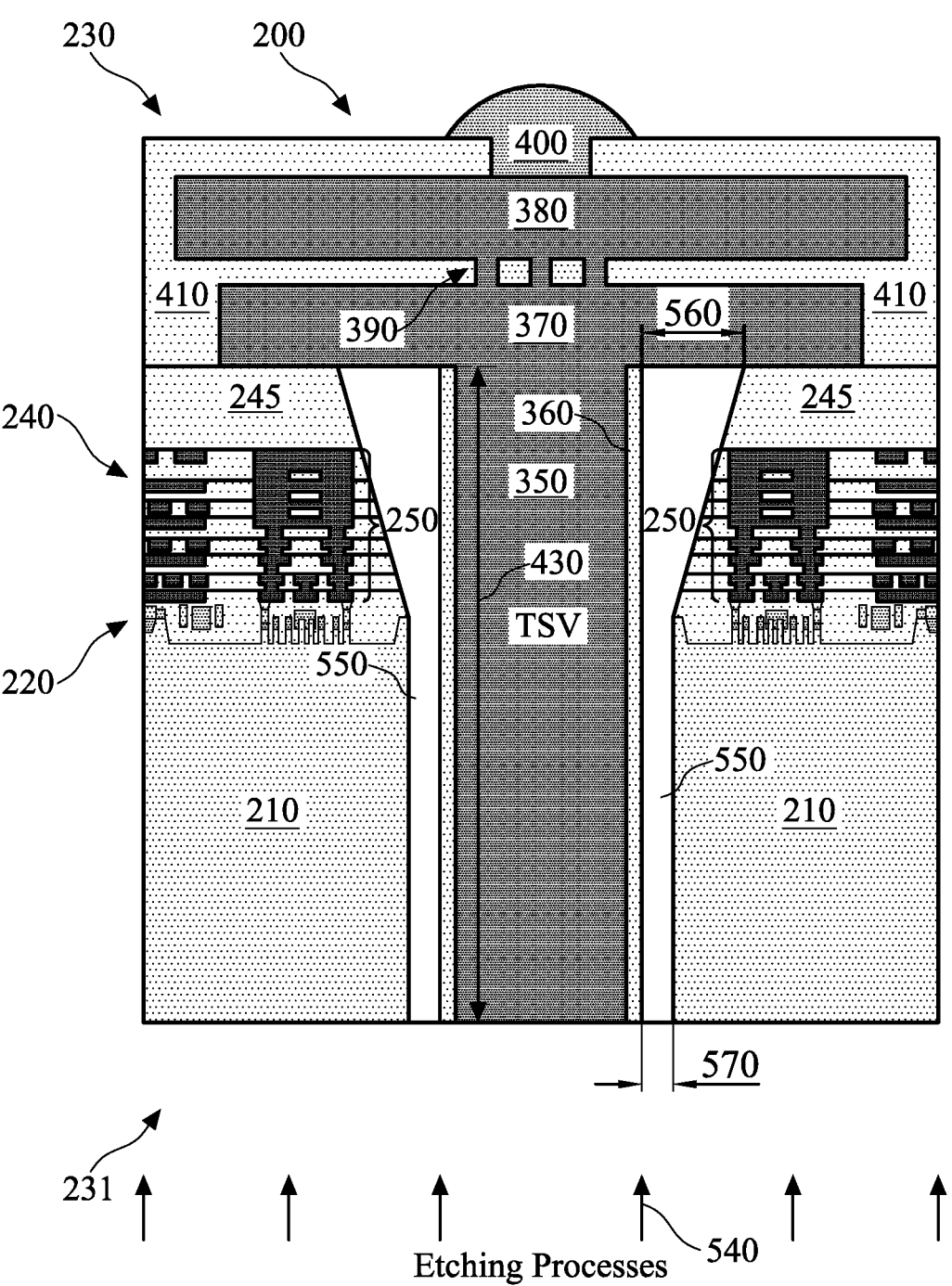

Referring now to FIG. 11, one or more etching processes 540 may be performed to the 3DIC device 200 to form air liners 550 between the substrate 210 and the TSV structure 350. The one or more etching processes 540 may include wet etching processes, dry etching processes, or combinations thereof. The one or more etching processes 540 are configured to have an etching selectivity between the liner layer 310 and the substrate 210 and the TSV structure 350. For example, one or more etching processes 540 may be configured to have a substantially higher etching rate (e.g., five times greater, ten times greater, or more) for the liner layer 310 than for the substrate 210 or the TSV structure 350. As such, when the one or more etching processes 540 are performed from the back side 231 of the 3DIC device 200, portions of the liner layer 310 are etched away at the substantially higher etching rate than the substrate 210. Unlike the first embodiment, where the liner layer 310 is partially removed, the liner layer 310 is completely removed in the second embodiment. That is, after the etching processes 540 are performed, portions of the bottom surface of the conductive pad 370 are exposed to the back side 231.

Note that one inherent result of the etching processes 540 being performed to completely remove the liner layer 310 is that the resulting air liners 550 are each wider at the top and narrower at the bottom. For example, each air liner 550 has a horizontal dimension 560 at the top and a horizontal dimension 570 at the bottom. The horizontal dimension 560 is greater than the horizontal dimension 570. In some embodiments, the horizontal dimension 560 is in a range between about 0.15 microns and about 0.5 microns, and the horizontal dimension 570 is in a range between about 0.1 microns and about 0.3 microns. Another inherent result of the etching processes 540 being performed to completely remove the liner layer 310 is that the air liners 550 may have a slanted side surface 550A, which is defined by the sidewall of the dielectric material 245.

These physical traits of the air liners 550 (e.g., wider top portion and slanted side surface) in the second embodiment are inherent results of the etching processes 540, for example, due to the etching selectivity associated with the etching processes 540. More specifically, the substrate 210 (e.g., containing silicon) and the liner layer 310 (e.g., containing a low-k dielectric material) may have a greater etching selectivity, and therefore the portion of the air liner 550 formed beside the substrate 210 may have substantially straight sidewalls. On the other hand, the etching selectivity between the liner layer 310 and the regions of the 3DIC device 200 containing the dielectric materials 245 may be less than the etching selectivity between the liner layer 310 and the substrate 210. Therefore, the dielectric materials 245 may also be partially etched during the removal of the liner layer 310. Accordingly, the air liner 550 has a greater width (e.g., the horizontal dimension 560) at its upper portion.

Figure 12:
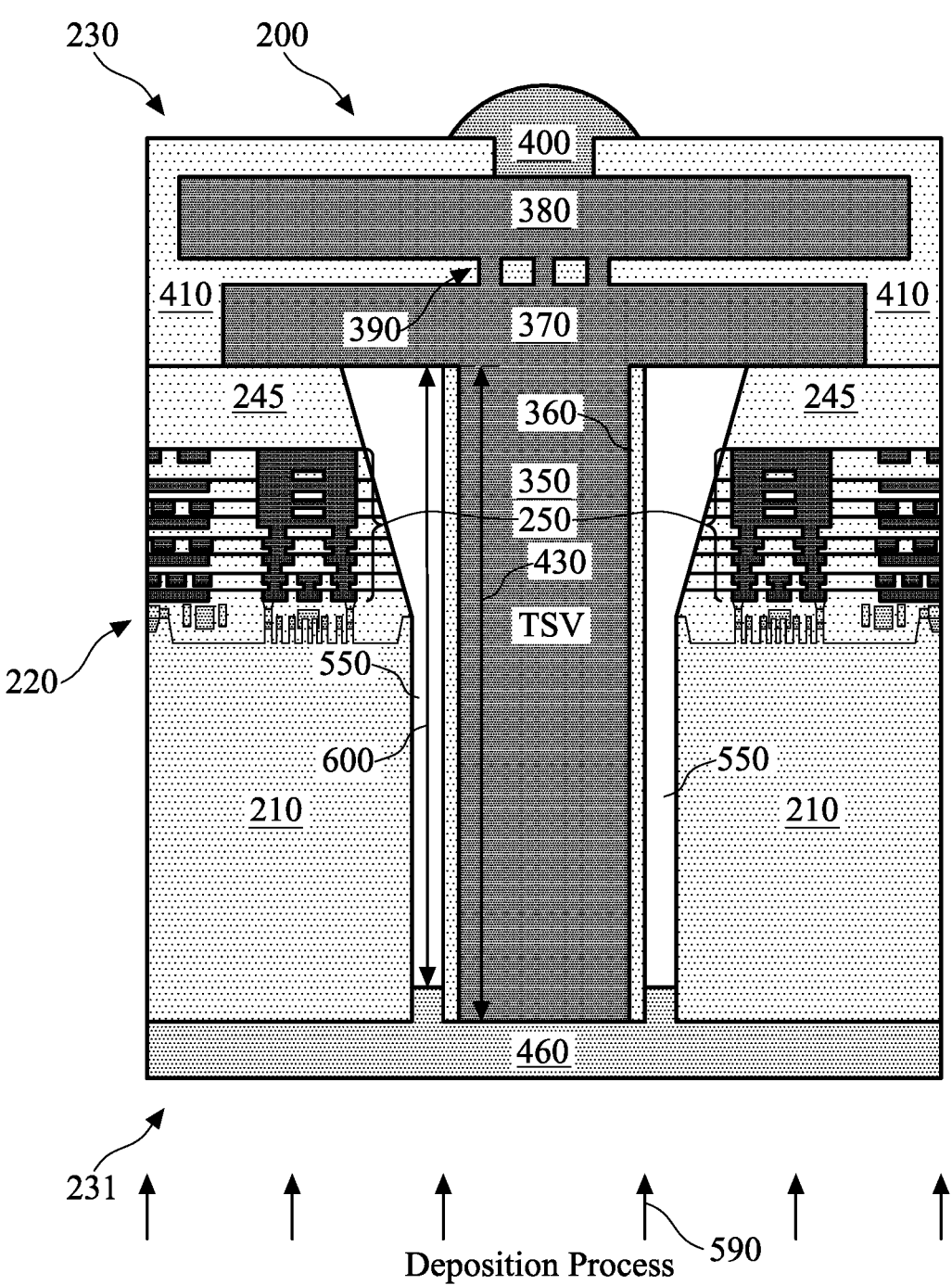

Referring now to FIG. 12, a deposition process 590 is performed to form the isolation film 460 on the back side 231 of the 3DIC device 200. As discussed above, the isolation film 460 may include silicon oxide, silicon nitride, or polyimide, and it may partially (but not completely) fill the air liners 550. In other words, the isolation film 460 is formed to plug up or otherwise seal the air liners 550 from the back side 231. At this point, the air liners 550 each a vertical dimension 600.

Figure 13:
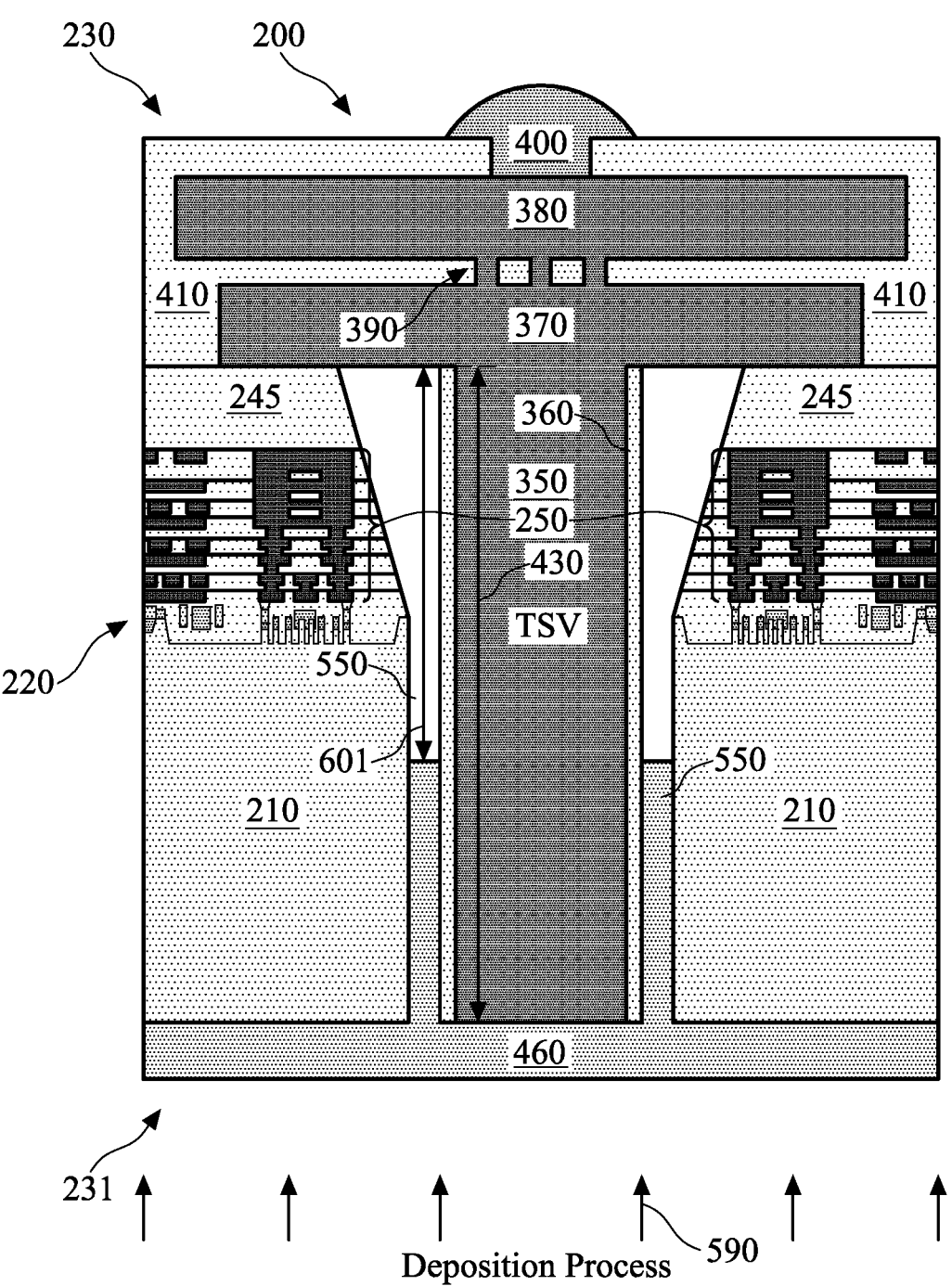

Similar to the first embodiment of the present disclosure, the vertical dimension 600 of the air liners 550 is also tunable in the second embodiment of the present disclosure. However, rather than configuring the process parameters (e.g., etching time and/or etchant) of the etching processes 540 to tune the vertical dimension 600 of the air liners 550, the second embodiment may tune the vertical dimension 600 by adjusting the amount of the isolation film 460 that protrudes into the air liners 550. For example, as shown in FIG. 13, the air liners 550 may have a vertical dimension 601 that is less than the vertical dimension 600 shown in FIG. 12. The smaller vertical dimension 601 is a result of a greater amount of the isolation film 460 that protrudes into the air liners 550, which results in a shorter length (e.g., smaller vertical dimension 601) for the air liners 550. Regardless of how the length of the air liners 550 is configured, the fact that it is still tunable in the second embodiment still allows the overall dielectric constant (and therefore the capacitance) of the 3DIC device 200 to be flexibility configured as well, depending on design needs and/or fabrication requirements.

Figure 14:
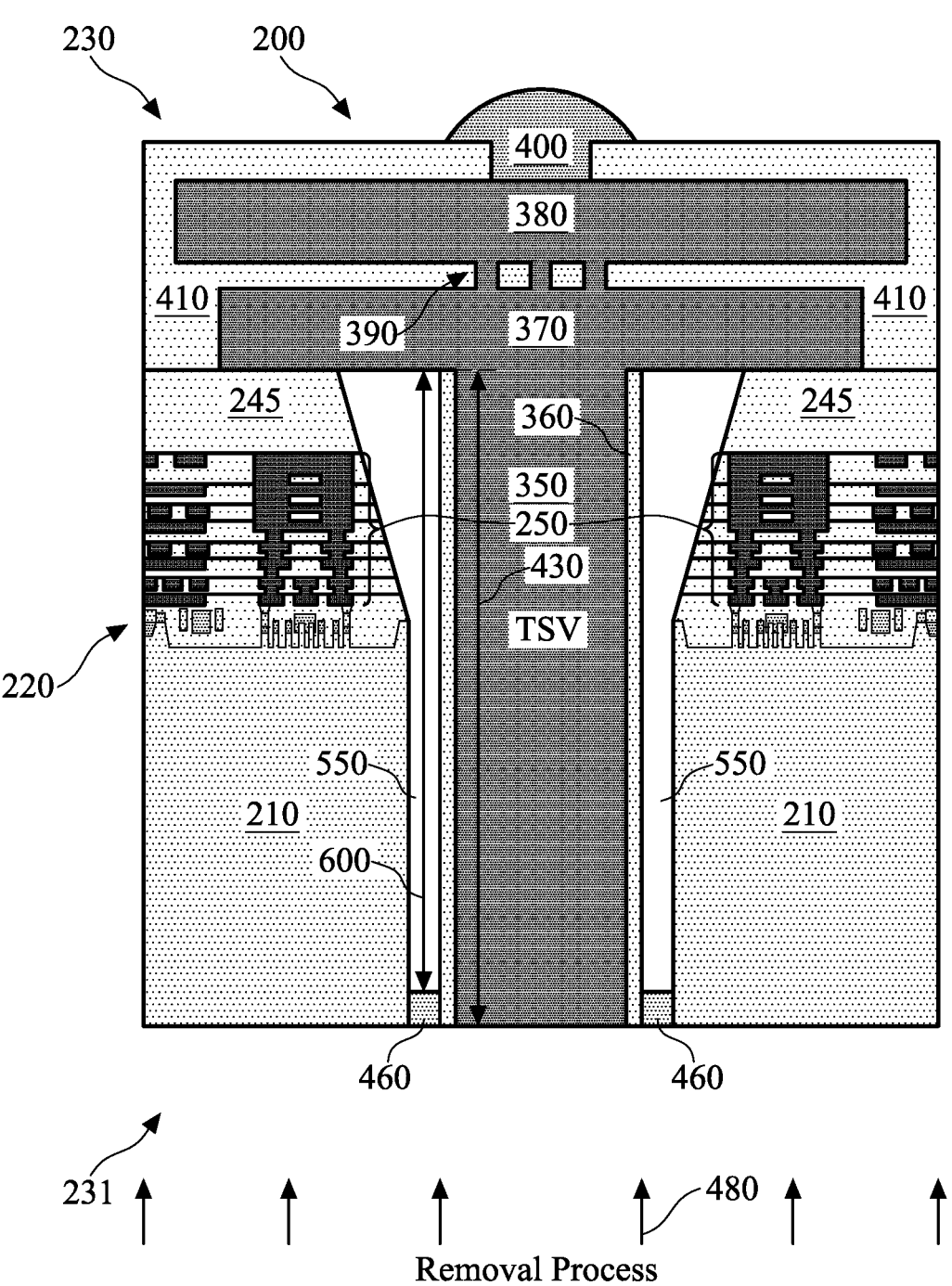

Referring now to FIG. 14, the removal process 480 may be performed to the 3DIC device 200 from the back side 231 to partially remove the isolation film 460. For example, the removal process 480 may include dry etching processes, CMP processes, or combinations thereof. The removal process 480 is configured to stop when the substrate 210 is reached or when the TSV structure 350 is reached. After the removal process 480 has been performed, the substrate 210 and the TSV structure 350 are exposed to the back side 231. The remaining portions of the isolation film 460 still seal the air liners 450, so that the air liners 450 are not exposed to the back side 231.

Figure 15:
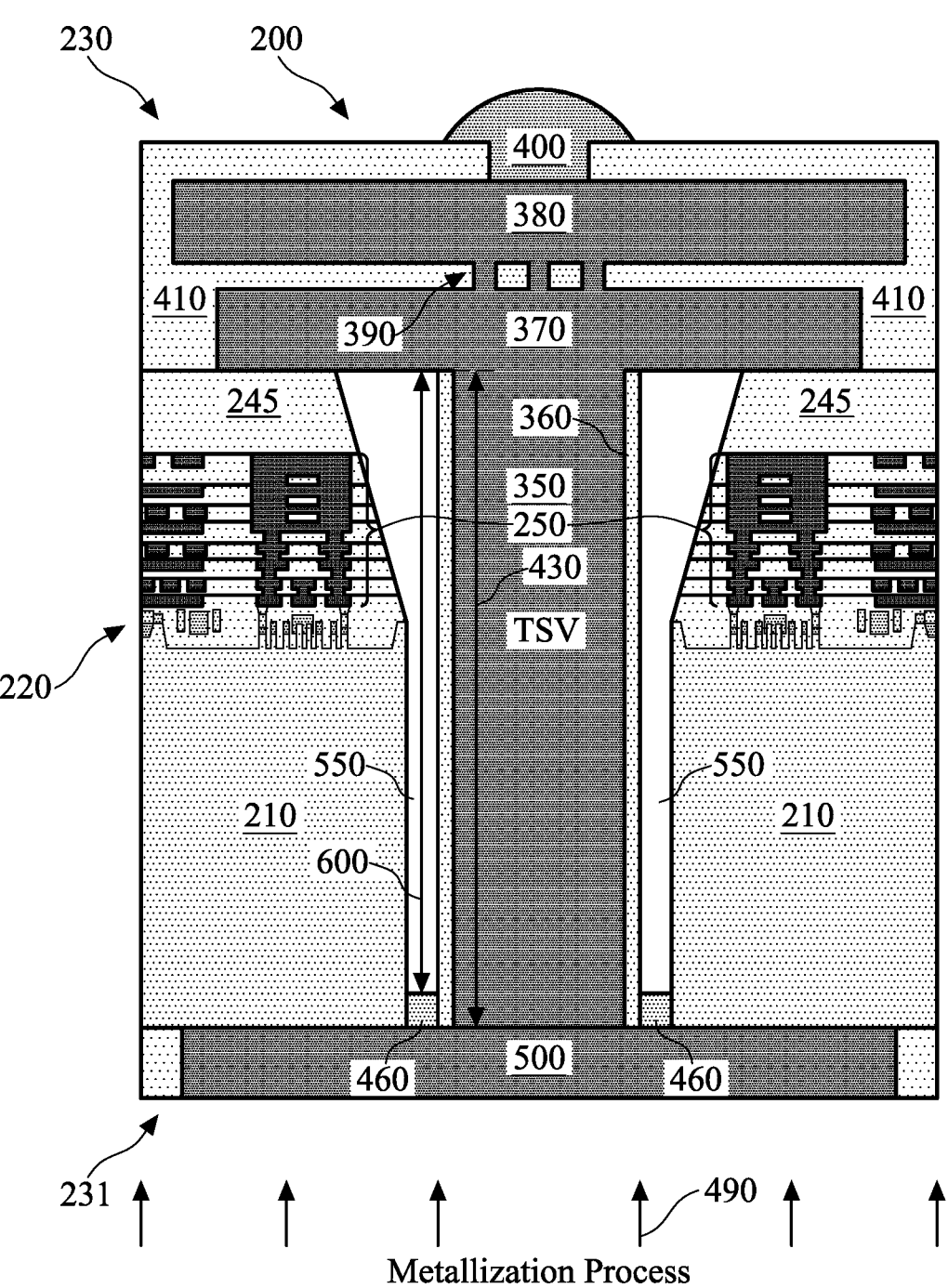

Referring now to FIG. 15, a metallization process 490 may be performed to the 3DIC device 200 to form a conductive pad 500 over the back side 231 of the 3DIC device 200. For example, the conductive pad 500 is formed on the back side surfaces of the substrate 210, the TSV structure 350, and the remaining portions of the isolation film 460. The conductive pad 500 includes a conductive material (e.g., copper or aluminum), and as such, the conductive pad 500 is electrically coupled to the conductive pads 370 and 380 by the TSV structure 350.

Although the second embodiment (corresponding to FIGS. 10-15) forms air liners 550 that are shaped differently than the air liners 450 of the first embodiment (corresponding to FIGS. 2-9), it still achieves substantially the same benefits as the first embodiment, for example, reduced parasitic capacitance, tunable overall capacitance, and faster speed.

Figure 16:
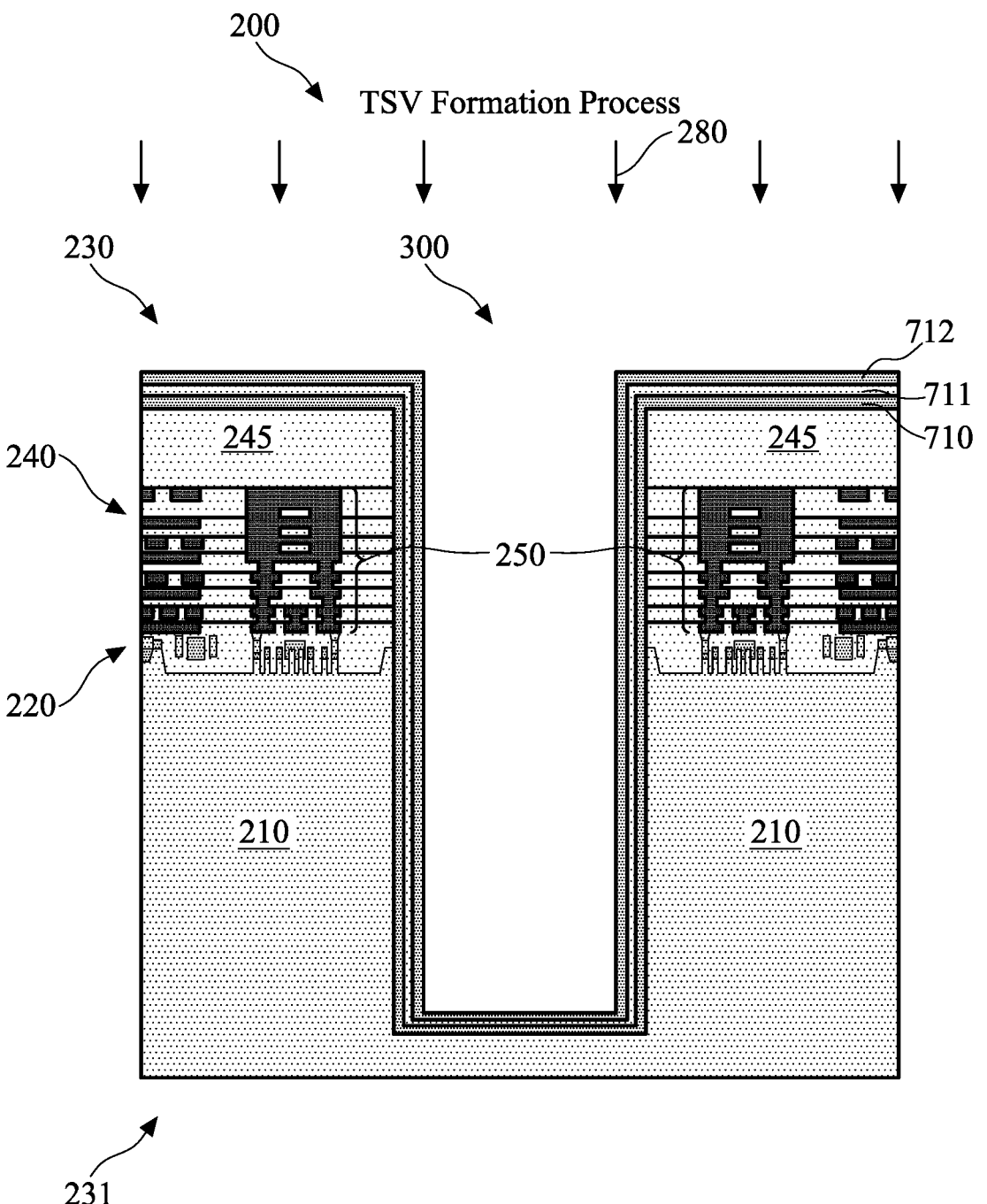

A third embodiment of forming air liners will be discussed below with reference to FIGS. 16-24. For reasons of consistency and clarity, similar components appearing in FIGS. 2-24 will be labeled the same. Referring now to FIG. 16, the third embodiment of the present disclosure also performs the etching processes 280 discussed above with reference to FIG. 2 to etch the opening 300 partially into the substrate 210. However, whereas the first embodiment forms just one liner layer 310 over the front side 230 of the 3DIC device 200, the third embodiment forms a plurality of liner layers 710, 711, and 712 over the front side 230. Each of the liner layers 710-712 may be formed by a respective deposition process, such as ALD, CVD, PVD, etc. In some embodiments, the liner layer 711 is formed to have a different dielectric material than the liner layers 710 and 712. For example, the liner layers 710 and 712 may be formed to include a silicon oxide material, but the liner layer 711 is formed to include an aluminum oxide material, or another low-k dielectric material. The different material compositions between the liner layers 711 and 710/712 are configured to ensure that an etching selectivity can exist between them in an etching process performed subsequently.

Figure 17:
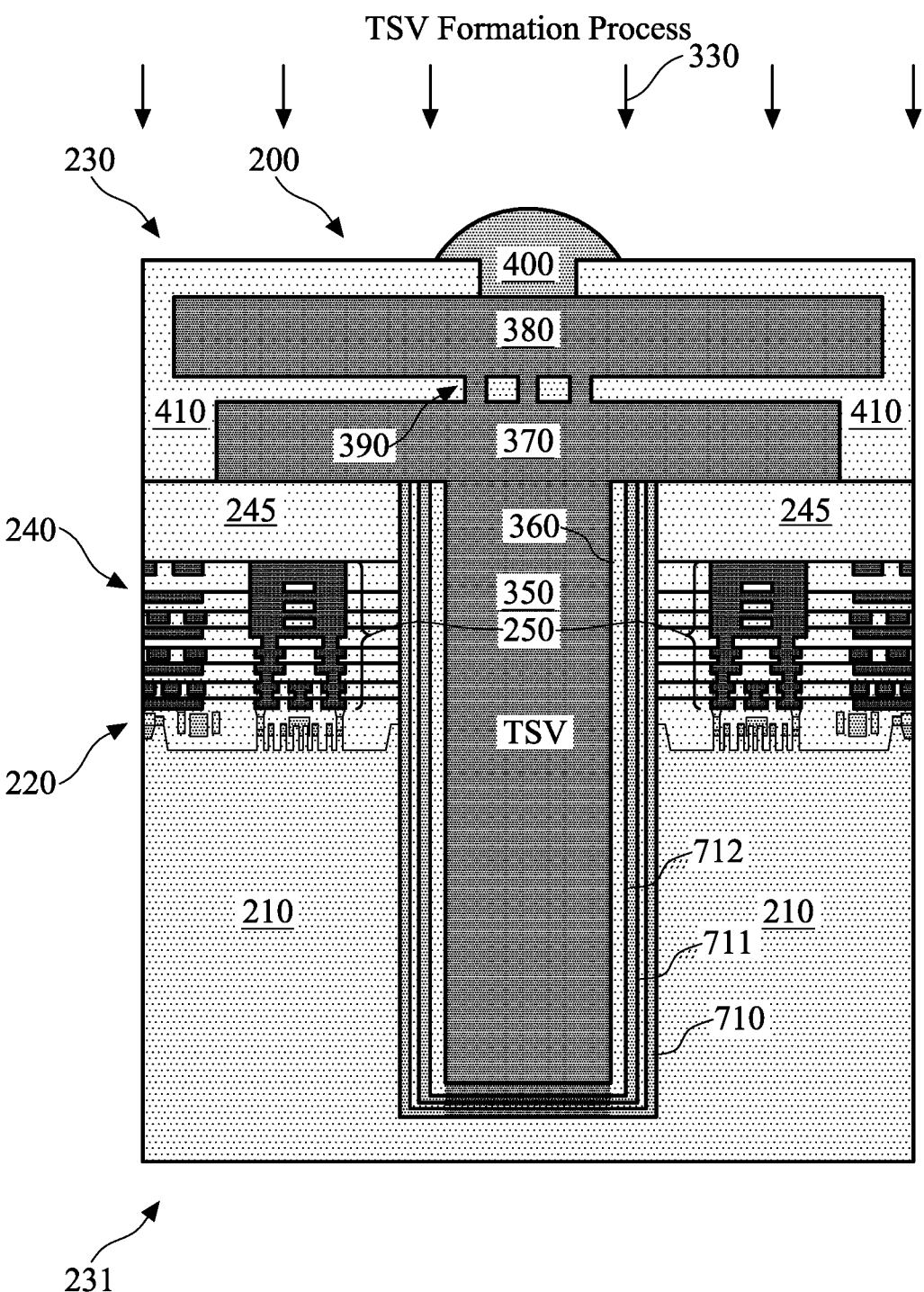

Referring now to FIG. 17, the TSV formation process 330 discussed above with reference to FIG. 3 is performed to form the TSV structure 350 in the opening 300. Thereafter, the conductive pads 370 and 380, the conductive vias 390, and the conductive bump 400 are also formed over the front side 230 of the 3DIC device 200.

Figure 18:
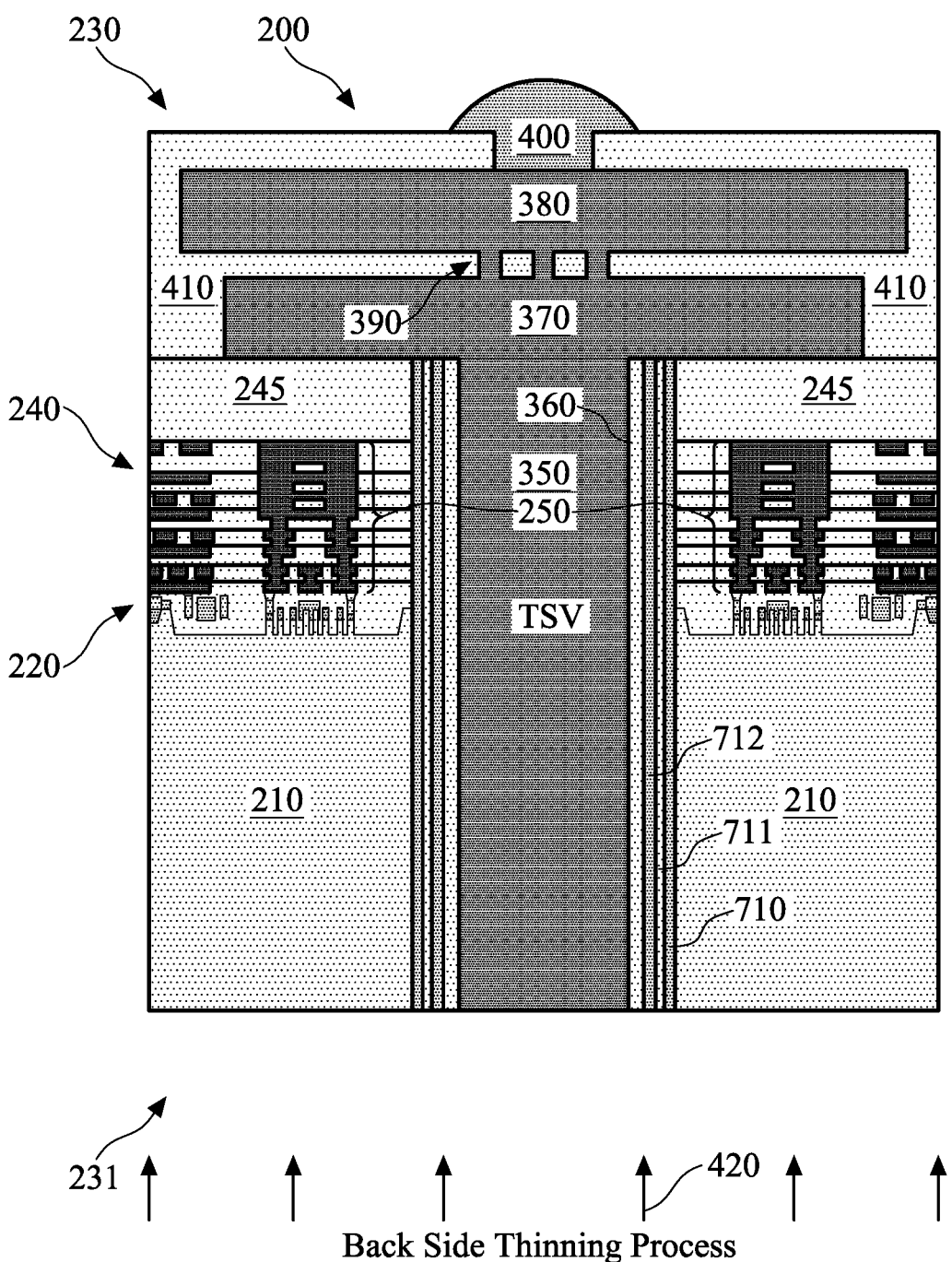

Referring now to FIG. 18, the back side thinning process 420 discussed above with reference to FIG. 4 is performed. A discussed above, the back side thinning process 420 may include chemical etching and/or mechanical grinding processes to remove portions of the 3DIC device 200 from the back side 231 until the bottom surface of the TSV structure 350 is exposed.

Figure 19:
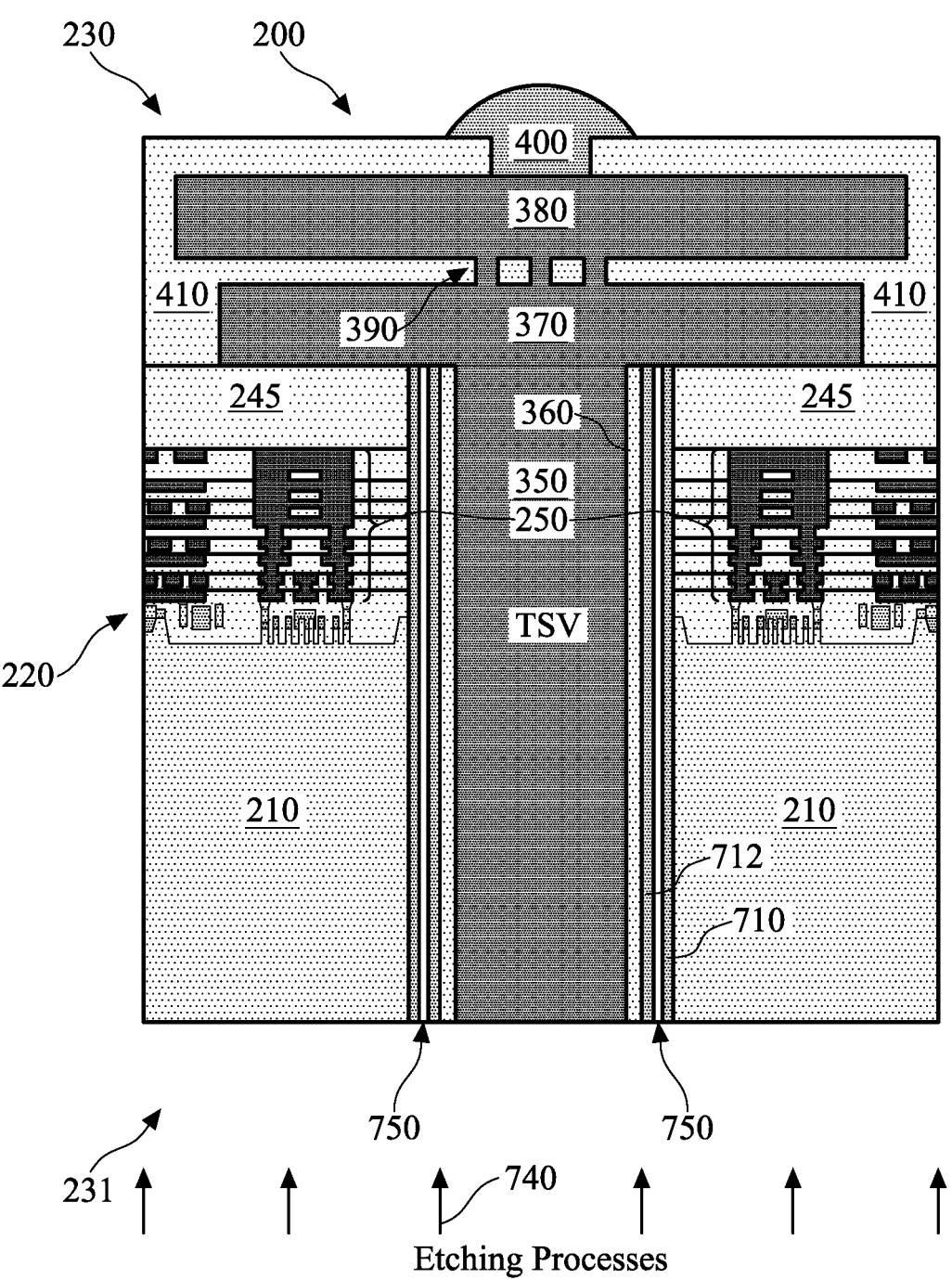

Referring now to FIG. 19, one or more etching processes 740 may be performed to the 3DIC device 200 to form air liners 550 between the liner layer 710 and the liner layer 712 by removing the liner layer 711. In more detail, the one or more etching processes 740 may include wet etching processes, dry etching processes, or combinations thereof. The one or more etching processes 740 are configured to have an etching selectivity between the liner layer 711 and the other liner layers 710 and 712. An etching selectivity may also exist between the liner layer 711 and the substrate 210 and the TSV structure 350. For example, the one or more etching processes 740 may be configured to have a substantially higher etching rate (e.g., five times greater, ten times greater, or more) for the liner layer 711 than for the liner layers 710 and 712, the substrate 210, or the TSV structure 350. As such, when the one or more etching processes 740 are performed from the back side 231 of the 3DIC device 200, portions of the liner layer 711 are etched away at the substantially higher etching rate than the liner layers 710 and 712, the substrate 210, and the TSV structure 350. In the embodiment shown in FIG. 19, the liner layer 711 is completely removed, such that portions of the bottom surface of the conductive pad 370 are exposed to the back side 231. In other variations of the third embodiment, however, it is understood that the liner layer 711 may be partially removed, such that the length of the air liner 750 is shorter.

Figure 20:
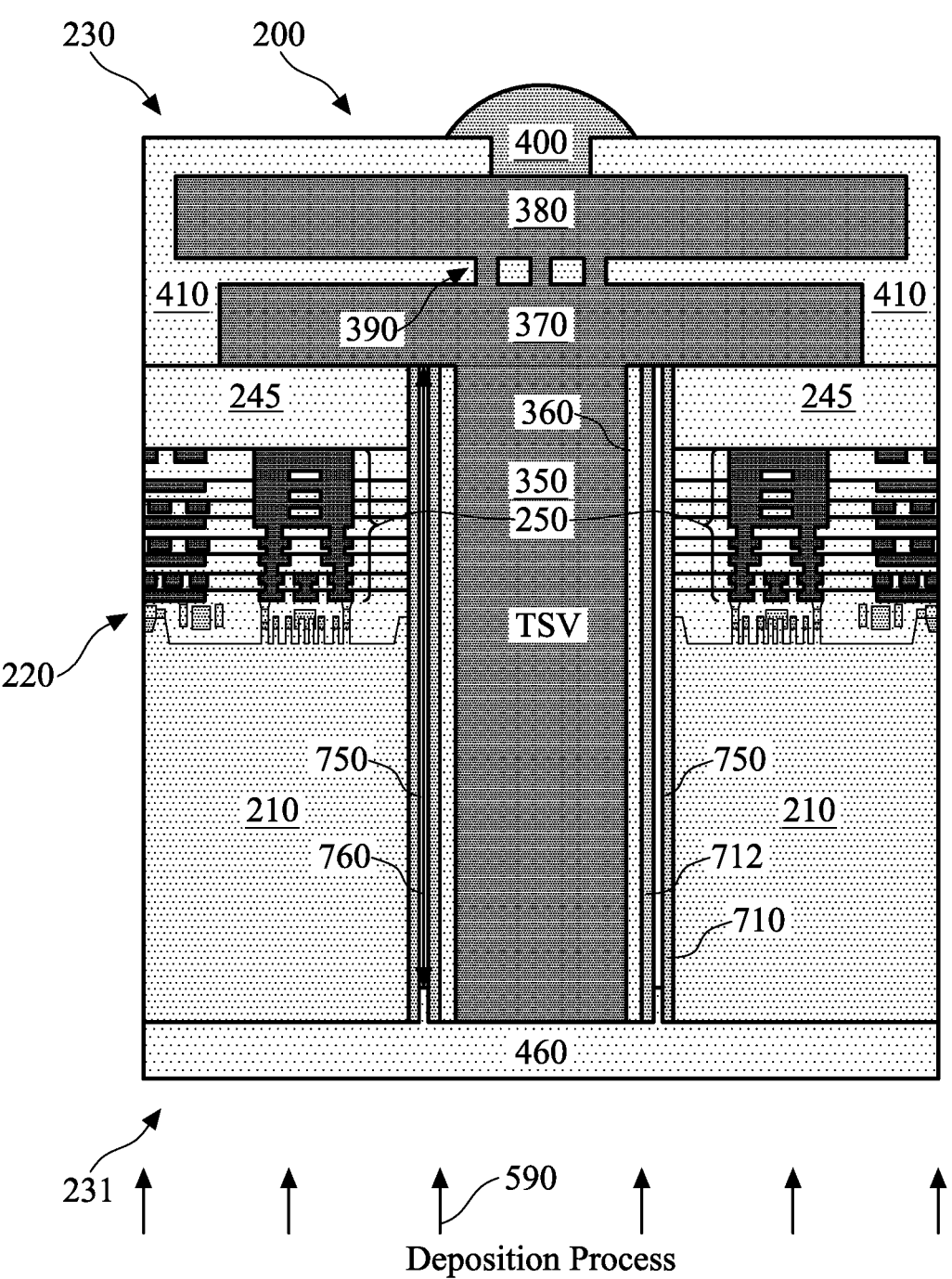

Referring now to FIG. 20, a deposition process 590 is performed to form the isolation film 460 on the back side 231 of the 3DIC device 200. As discussed above, the isolation film 460 may include silicon oxide, silicon nitride, or polyimide, and it may partially (but not completely) fill the air liners 750. In other words, the isolation film 460 is formed to plug up or otherwise seal the air liners 750 from the back side 231. At this point, the air liners 750 each a vertical dimension 760.

Figure 21:
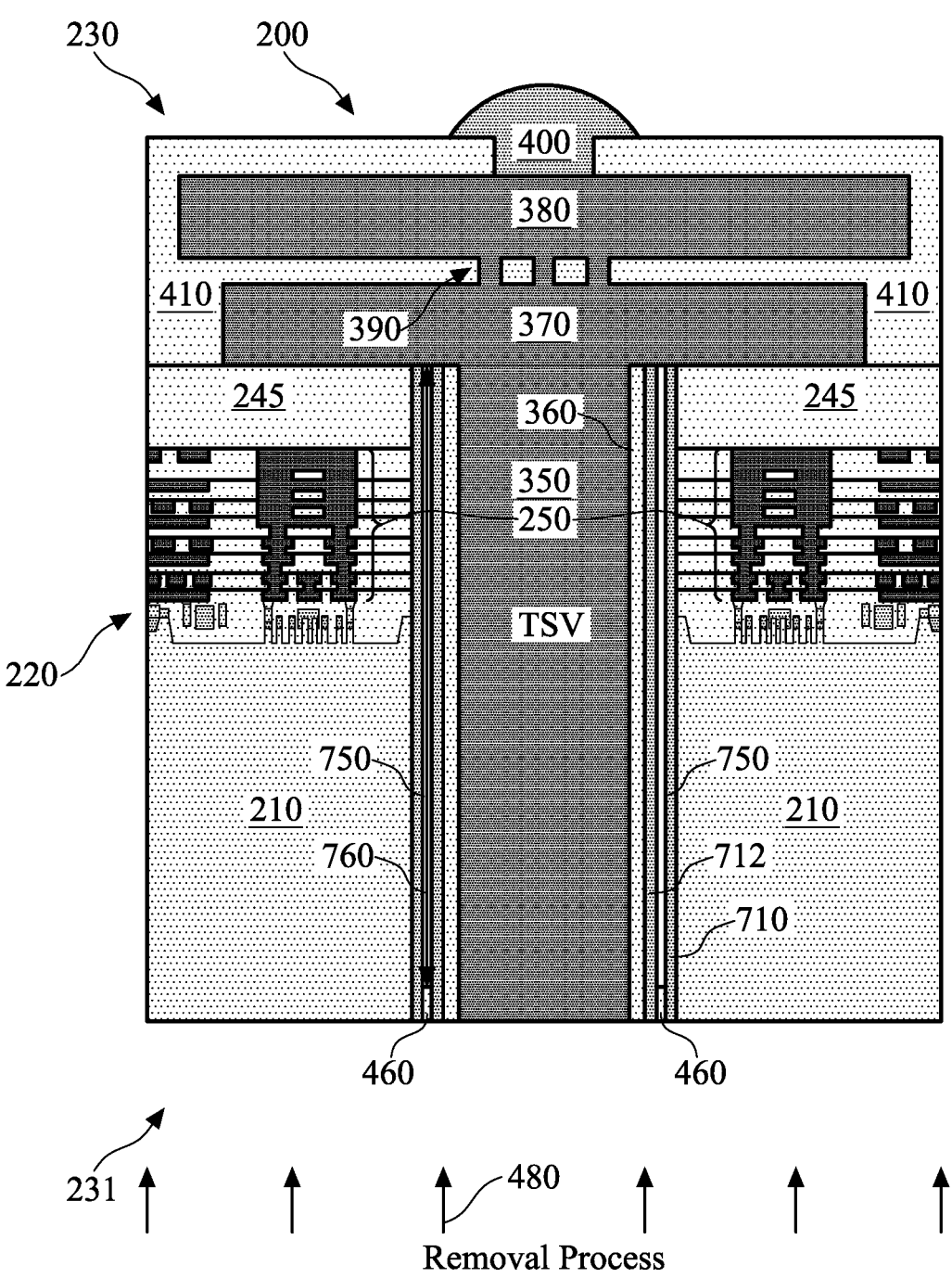

Referring now to FIG. 21, the removal process 480 discussed above with reference to FIG. 6 may be performed to the 3DIC device 200 from the back side 231 to partially remove the isolation film 460. For example, the removal process 480 may include dry etching processes, CMP processes, or combinations thereof. The removal process 480 is configured to stop when the substrate 210 is reached or when the TSV structure 350 is reached. After the removal process 480 has been performed, the substrate 210 and the TSV structure 350 are exposed to the back side 231. The remaining portions of the isolation film 460 still seal the air liners 750, so that the air liners 750 are not exposed to the back side 231.

Figure 22:
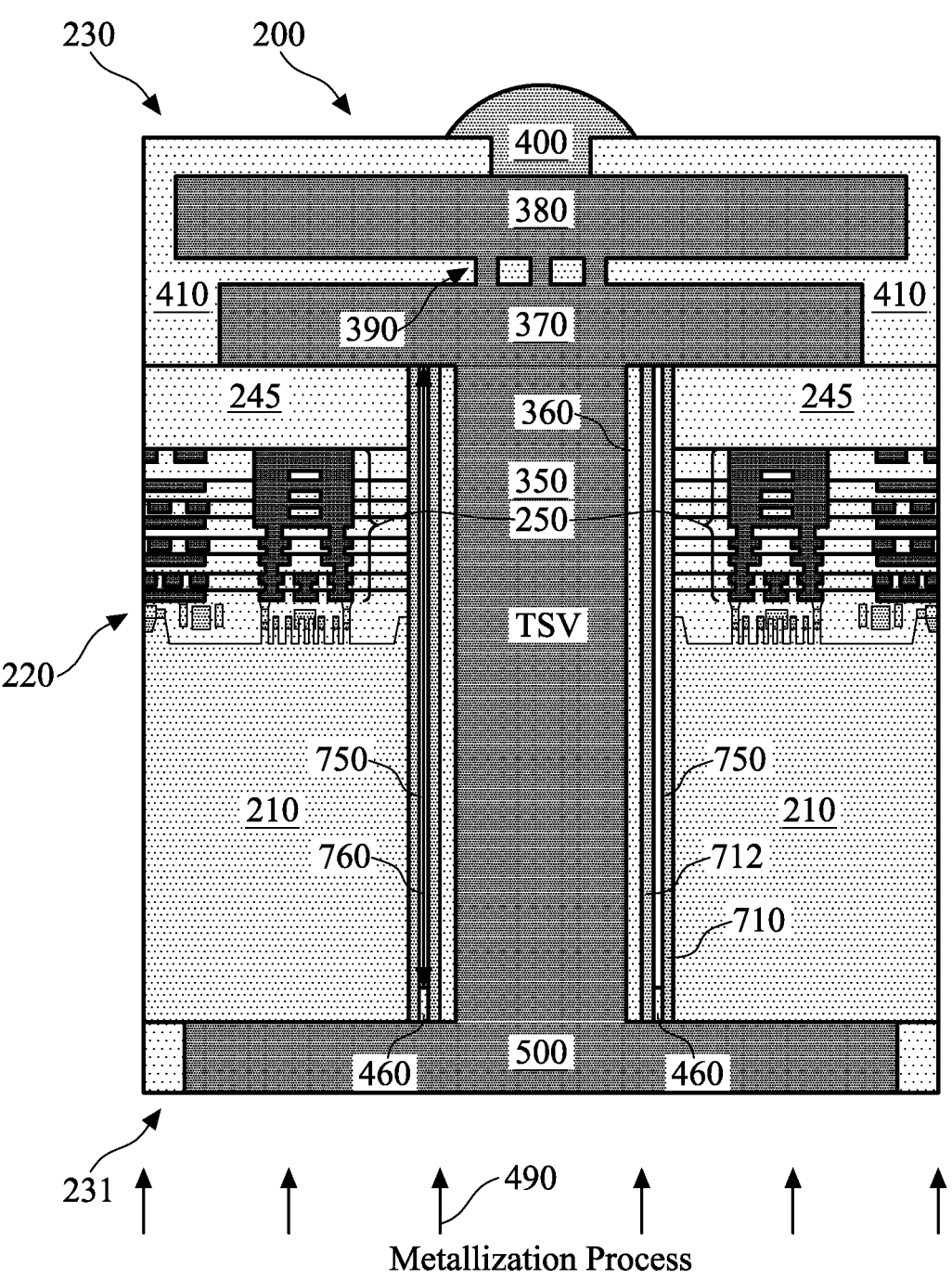

Referring now to FIG. 22, the metallization process 490 may be performed to the 3DIC device 200 to form the conductive pad 500 over the back side 231 of the 3DIC device 200. For example, the conductive pad 500 is formed on the back side surfaces of the substrate 210, the TSV structure 350, and the remaining portions of the isolation film 460. As discussed above, the conductive pad 500 is electrically coupled to the conductive pads 370 and 380 by the TSV structure 350.

Figure 23:
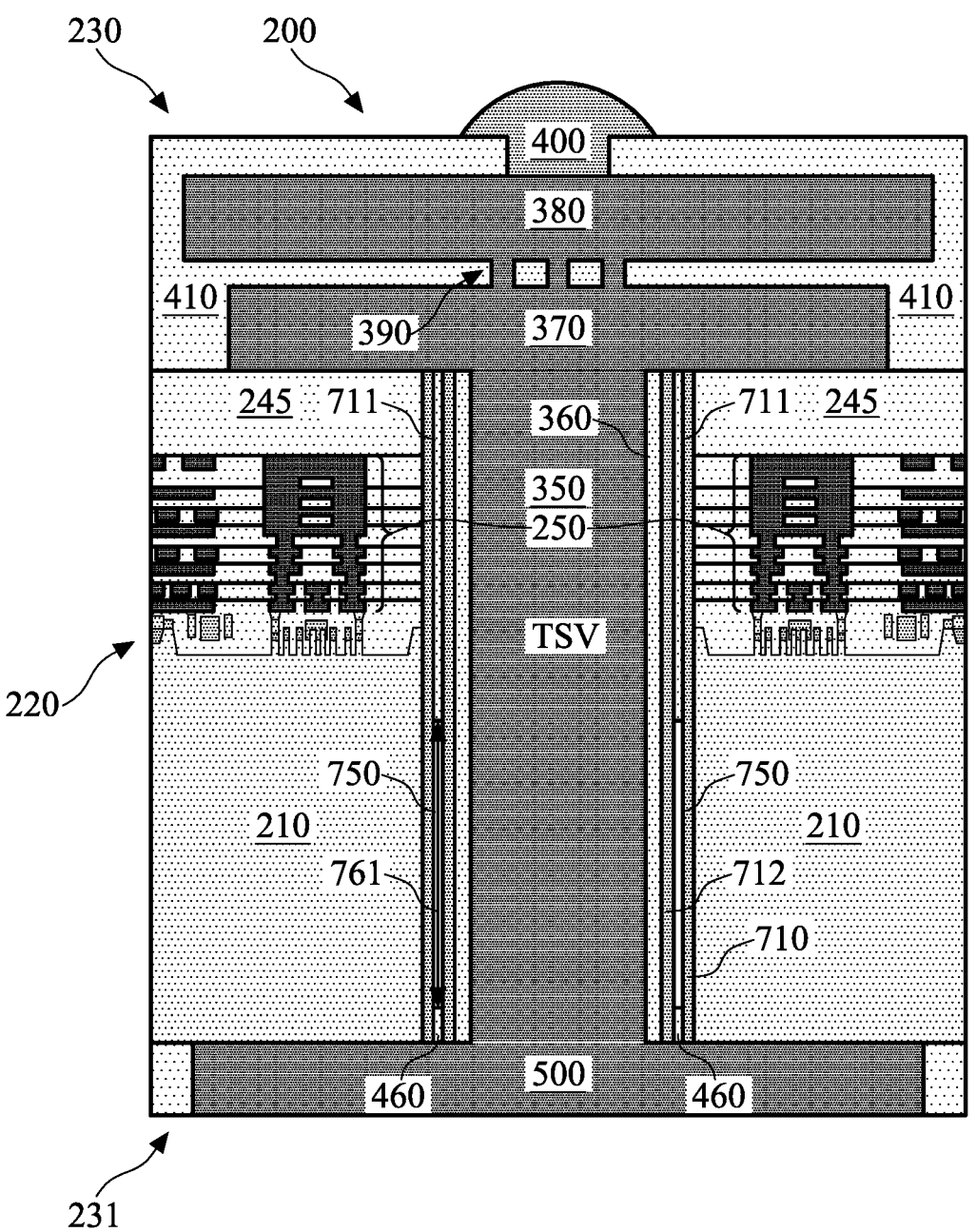
Figure 24:
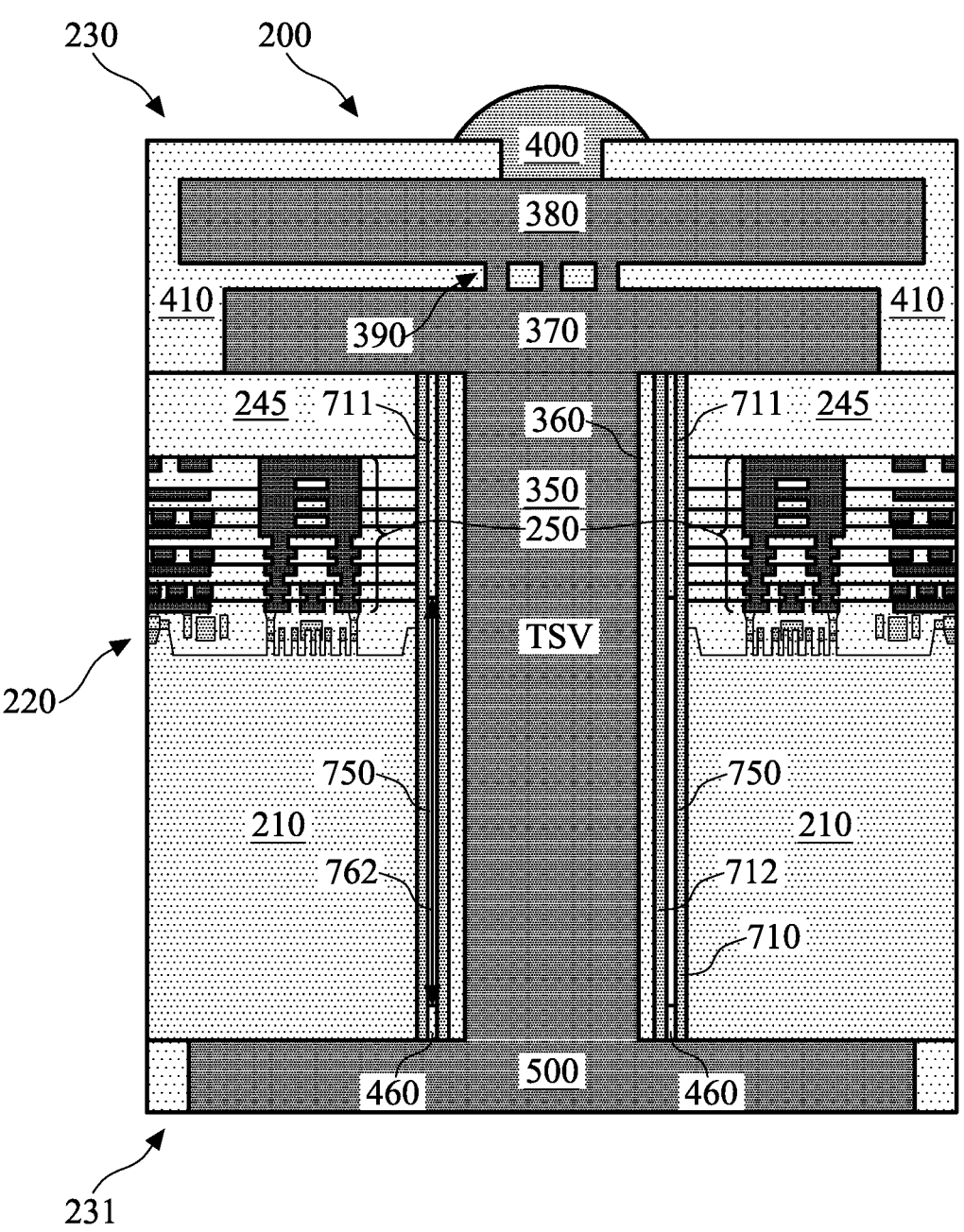

Similar to the first embodiment of the present disclosure, the vertical dimension 760 of the air liners 750 is also tunable in the third embodiment of the present disclosure. For example, the process parameters (e.g., etching time and/or etchant) of the etching processes 740 may be tuned to control the vertical dimension 760 of the air liners 750. Examples of this are shown in FIGS. 23 and 24. In FIG. 23, the liner layer 711 is not completely removed by the etching processes 740. The remaining portions of the liner layer 711 each have a bottom surface that is below (e.g., having a lower vertical elevation than) the upper surface of the substrate 210. As such, the air liners 750 each have a vertical dimension 761 that is less than the vertical dimension 760 of FIG. 22.

Similarly, in FIG. 24, the liner layer 711 is also not completely removed by the etching processes 740. The remaining portions of the liner layer 711 each have a bottom surface that is above (e.g., having a higher vertical elevation than) the upper surface of the substrate 210. As such, the air liners 750 each have a vertical dimension 762 that is less than the vertical dimension 760 of FIG. 22 but greater than the vertical dimension 761 of FIG. 23.

In addition to configuring the etching processes 740 to tune the vertical dimension of the air liner 750, the third embodiment can also tune the vertical dimension of the air liners by adjusting the amount of the isolation film 460 that is deposited into the air liners 750. Furthermore, the horizontal dimension (e.g., the width) of the air liners 750 may be tuned by adjusting the horizontal dimension of the liner layer 711 when the liner layer 711 was initially deposited, since the formation of the air liners 750 is a direct result of removing the liner layer 711. Regardless of how the vertical dimension or horizontal dimension of the air liners 750 are set, the fact that it is still tunable in the third embodiment means that the overall dielectric constant (and therefore the capacitance) of the 3DIC device 200 can be flexibility configured as well, depending on design needs and/or fabrication requirements.

Figure 25:
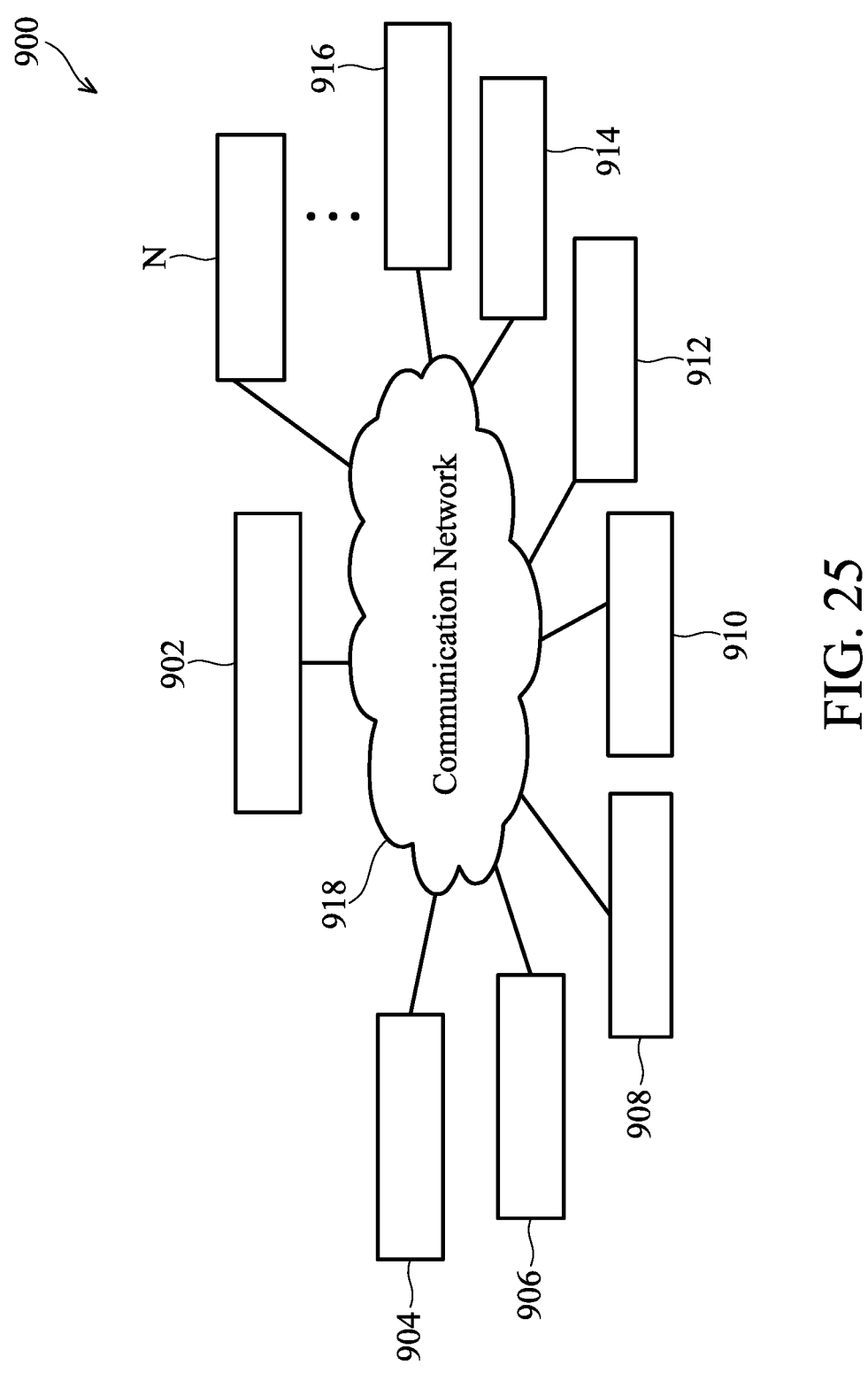
FIG. 25 illustrates an integrated circuit fabrication system according to various aspects of the present disclosure.

FIG. 25 illustrates an integrated circuit fabrication system 900 that may be used to fabricate the 3DIC device 200 according to embodiments of the present disclosure. The fabrication system 900 includes a plurality of entities 902, 904, 906, 908, 910, 912, 914, 916, . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such an EUV tool that is used to perform lithography processes to define the gate spacers of an SRAM device; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

Figure 26:
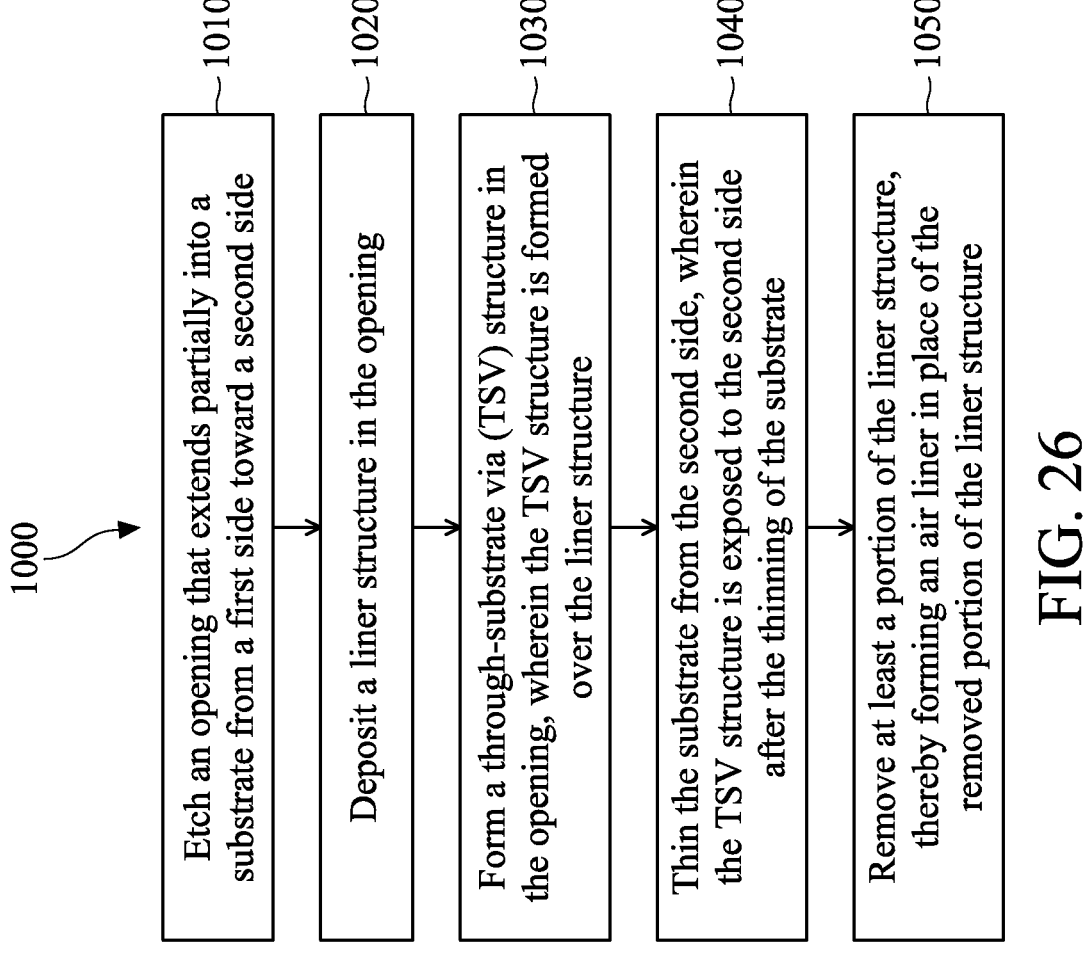
FIG. 26 is a flowchart illustrating a method of fabricating an IC device according to various aspects of the present disclosure.

FIG. 26 is a flowchart illustrating a method 1000 of fabricating a semiconductor device. The method 1000 includes a step 1010 to etch an opening that extends partially into a substrate from a first side toward a second side.

The method 1000 includes a step 1020 to deposit a liner structure in the opening.

The method 1000 includes a step 1030 to form a through-substrate via (TSV) structure in the opening. The TSV structure is formed over the liner structure.

The method 1000 includes a step 1040 to thin the substrate from the second side. The TSV structure is exposed to the second side after the thinning of the substrate.

The method 1000 includes a step 1050 to remove at least a portion of the liner structure, thereby forming an air liner in place of the removed portion of the liner structure.

In some embodiments, at least a first guarding ring structure and a second guard ring structure are disposed over the first side of the substrate. The opening separates the first guard ring structure from the second guard ring structure. The air liner is formed between the first guard ring structure and the TSV structure, or between the second guard ring structure and the TSV structure.

In some embodiments, the step 1020 comprises depositing a dielectric liner having a dielectric constant lower than a dielectric constant of silicon dioxide.

In some embodiments, the step 1050 comprises completely removing the liner structure.

In some embodiments, the step 1020 comprises depositing a first liner layer as a bottom layer of the liner structure, a second liner layer as a middle layer of the liner structure, and a third liner layer as a top layer of the liner structure. The TSV structure is deposited over the third liner layer. The step 1050 comprises at least partially removing the second liner layer without substantially affecting the first liner layer or the second liner layer. In some embodiments, the step 1050 comprises completely removing the second liner layer. In some embodiments, the step 1020 comprises depositing a first type of oxide material as the first liner layer and the third liner layer, and depositing a second type of oxide material as the second liner layer. In some embodiments, the step 1050 comprises performing an etching process having an etching selectivity between the first type of oxide material and the second type of oxide material.

It is understood that additional steps may be performed before, during, or after the steps 1010-1050. For example, in some embodiments, the method 1000 may further include a step that is performed after the step 1050. In this step, the air liner is sealed from the second side with an isolation film. The method 1000 may also include a step performed after the TSV structure is formed but before the substrate is thinned from the second side. In this step, a first conductive pad is formed over the TSV from the first side. After the air liner is sealed, a second conductive pad is formed over the TSV from the second side. The TSV is electrically coupled to the first conductive pad and the second conductive pad. For reasons of simplicity, other additional processes are not discussed herein in detail.

Based on the above discussions, it can be seen that the present disclosure implements air liners around TSV structures for a 3DIC device. In more detail, a dielectric liner layer is deposited in an opening that extends partially through a substrate. A TSV structure is formed in the opening. The dielectric liner is removed (e.g., through etching) at least partially to form air liners around the TSV structure. An isolation film may be deposited to seal the air liners too.

The unique fabrication process flow and the resulting device structure of the present disclosure offers advantages over conventional devices. It is understood, however, that no particular advantage is required, other embodiments may offer different advantages, and that not all advantages are necessarily disclosed herein. One advantage is the reduction in parasitic capacitance. For example, air has a lower dielectric constant than other types of dielectric materials. Thus, implementing air liners (as opposed to other types of dielectric liners) around a TSV structure will lead to a reduction in the overall dielectric constant, which in turn translates into a reduction in parasitic capacitance. The reduction in parasitic capacitance may lead to device improvements such as speed. Another advantage is the tunability of capacitance. Specifically, the length of the air liners can be flexibly tuned by configuring process parameters (e.g., etching time) of the etching processes used to form the air liners, or by configuring the amount of isolation film that is deposited into the air liners. By tuning the size of the air liners, the corresponding capacitance associated with the air liners can be configured, which also affects the overall capacitance of the 3DIC device. Other advantages may include ease of fabrication and compatibility with existing fabrication processes.

The advanced lithography process, method, and materials described above can be used in many applications, including in IC devices using fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the various aspects of the present disclosure discussed above may apply to multi-channel devices such as Gate-All-Around (GAA) devices. To the extent that the present disclosure refers to a fin structure or FinFET devices, such discussions may apply equally to the GAA devices.

One aspect of the present disclosure pertains to an IC device. A first conductive pad disposed over a first side of a substrate in a first direction. A second conductive pad is disposed over a second side of the substrate in the first direction. A through-substrate via (TSV) extends into the substrate in the first direction. The TSV is disposed between the first conductive pad and the second conductive pad in the first direction. An air liner disposed between the TSV and the substrate in a second direction different from the first direction.

One aspect of the present disclosure pertains to an IC device. The IC device includes a substrate. The IC device includes a first guard ring structure and a second guard ring structure each disposed over the substrate. The IC device includes a through-substrate via (TSV) extending partially through the substrate. The TSV separates the first guard ring structure and the second guard ring structure. The IC device includes an air gap disposed between the TSV and the substrate.

Yet another aspect of the present disclosure pertains to a method. An opening is etched that extends partially into a substrate from a first side toward a second side. A liner structure is deposited in the opening. A through-substrate via (TSV) structure is formed in the opening. The TSV structure is formed over the liner structure. The substrate is thinned from the second side. The TSV structure is exposed to the second side after the thinning of the substrate. At least a portion of the liner structure is removed, thereby forming an air liner in place of the removed portion of the liner structure.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:

etching an opening that extends partially into a structure that includes a substrate and an interconnect structure formed over a first side of the substrate, wherein the opening is formed from the first side toward a second side and extends past the interconnect structure;

depositing a liner structure in the opening;

forming a through-substrate via (TSV) structure in the opening, wherein the TSV structure is formed over the liner structure;

thinning the substrate from the second side, wherein the TSV structure is exposed to the second side after the thinning of the substrate; and removing a portion, but not all, of the liner structure, thereby forming an air liner in place of the removed portion of the liner structure, wherein a remaining portion of the liner structure is disposed laterally adjacent to the interconnect structure.

2. The method of claim 1, wherein:

the removing forms a first air liner and a second air liner in place of the removed portion of the liner structure in a cross-sectional side view;

at least a first guard ring structure and a second guard ring structure are formed as a part of the interconnect structure and are disposed over the first side of the substrate in the cross-sectional side view;

the opening separates the first guard ring structure from the second guard ring structure in the cross-sectional side view; and the first air liner is formed between the first guard ring structure and the TSV structure in the cross-sectional side view, and the second air liner is formed between the second guard ring structure and the TSV structure in the cross-sectional side view.

3. The method of claim 1, further comprising, after the removing, sealing the air liner from the second side with an isolation film.

4. The method of claim 3, further comprising:

after the forming the TSV structure but before the thinning, forming a first conductive pad over the TSV from the first side; and after the sealing, forming a second conductive pad over the TSV from the second side, wherein the TSV is electrically coupled to the first conductive pad and the second conductive pad.

5. The method of claim 4, further comprising:

forming a third conductive pad over the first side of the first conductive pad; and forming a conductive bump over the first side of the third conductive pad, wherein the conductive bump, the third conductive pad, and the first conductive pad are electrically coupled together.

6. The method of claim 3, wherein the sealing the air liner is performed at least in part by depositing a dielectric material as the isolation film from the second side, and wherein the dielectric material protrudes into the air liner.

7. The method of claim 1, wherein the depositing the liner structure comprises depositing a dielectric liner having a dielectric constant lower than a dielectric constant of silicon dioxide.

8. The method of claim 1, wherein:

the depositing comprises depositing a first liner layer as a bottom layer of the liner structure, a second liner layer as a middle layer of the liner structure, and a third liner layer as a top layer of the liner structure;

the TSV structure is deposited over the third liner layer; and the removing comprises at least partially removing the second liner layer without substantially affecting the first liner layer or the third liner layer.

9. The method of claim 8, wherein the removing comprises completely removing the second liner layer.

10. The method of claim 8, wherein:

the depositing comprises depositing a first type of oxide material as the first liner layer and the third liner layer, and depositing a second type of oxide material as the second liner layer; and the removing comprises performing an etching process having an etching selectivity between the first type of oxide material and the second type of oxide material.

11. The method of claim 1, wherein a portion of the liner structure is deposited over a first side of the interconnect structure, and wherein the forming of the TSV structure removes the portion of the liner structure deposited over the first side of the interconnect structure.

12. A method, comprising:

forming an opening in a structure that includes a substrate and an interconnect structure that is disposed over a first side of the substrate, the opening extending from a first side toward a second side and extending past the interconnect structure;

forming a dielectric liner in the opening, wherein the dielectric liner contains a material having a dielectric constant that is lower than a dielectric constant of silicon dioxide;

forming a through-substrate via (TSV) in the opening, the TSV being formed over the dielectric liner;

removing portions of the substrate from the second side until a portion of the TSV is exposed to the second side;

etching away a portion, but not all, of the dielectric liner, wherein an air gap is formed in place of the portion of the dielectric liner that has been etched away, and wherein a remaining portion of the dielectric liner is disposed laterally adjacent to the interconnect structure; and sealing the air gap from the second side with an isolation film.

13. The method of claim 12, wherein:

a first guard ring and a second guard ring are formed as a part of the interconnect structure; and the opening is formed such that it separates the first guard ring from the second guard ring.

14. The method of claim 12, further comprising:

after the TSV has been formed but before the portion of the dielectric liner has been etched away, forming a first conductive pad over the TSV from the first side; and after the sealing, forming a second conductive pad over the TSV from the second side, wherein the TSV is electrically coupled to the first conductive pad and the second conductive pad.

15. The method of claim 12, wherein:

the dielectric liner includes a bottom segment, a middle segment, and a top segment;

the TSV is formed over the top segment; and the etching away comprises removing the middle segment but not the bottom segment or the top segment.

16. The method of claim 15, wherein:

the bottom segment and the top segment have a first material composition;

the middle segment has a second material composition different from the first material composition; and the middle segment is removed at least in part via an etching process having an etching selectivity between the first material composition and the second material composition.

17. A method, comprising:

etching an opening into a structure that includes a substrate and an interconnect structure, wherein the opening extends from a first side of the substrate toward a second side of the substrate, and wherein a portion of the opening is formed laterally adjacent to the interconnect structure;

depositing a liner structure in the opening, wherein the liner structure includes a dielectric material;

forming a conductive via in the opening, wherein the conductive via is formed over the liner structure;

reducing a thickness of the substrate from the second side until the conductive via is exposed to the second side;

removing a portion, but not all, of the liner structure, wherein an air liner is formed in place of the removed portion of the liner structure, and wherein a remaining portion of the liner structure is located laterally adjacent to the interconnect structure; and forming an isolation film over the air liner from the second side of the substrate.

18. The method of claim 17, wherein:

at least a first guard ring structure and a second guard ring structure are formed as a part of the interconnect structure; and the air liner is formed between the first guard ring structure and the conductive via.

19. The method of claim 18, further comprising:

after the forming the conductive via but before the reducing the thickness, forming a first conductive pad over the conductive via from the first side of the substrate; and after the forming the isolation film, forming a second conductive pad over the conductive via from the second side of the substrate, wherein the conductive via is electrically coupled to the first conductive pad and the second conductive pad.

20. The method of claim 17, wherein:

the depositing the liner structure comprises depositing a first liner layer containing a first type of dielectric material, a second liner layer containing a second type of dielectric material, and a third liner layer containing the first type of dielectric material;

the conductive via is formed over the third liner layer; and the removing the portion of the liner structure comprises performing an etching process having a greater etching rate with respect to the second type of dielectric material than with respect to the first type of dielectric material.

\* \* \* \* \*